US012482698B2

(12) United States Patent
Chuang et al.

(10) Patent No.: US 12,482,698 B2
(45) Date of Patent: Nov. 25, 2025

(54) TESTING STRUCTURE FOR AN INTEGRATED CHIP HAVING A HIGH-VOLTAGE DEVICE

(71) Applicant: Taiwan Semiconductor Manufacturing Company, Ltd., Hsinchu (TW)

(72) Inventors: Harry-Hak-Lay Chuang, Zhubei (TW); Wei Cheng Wu, Zhubei (TW); Chung-Jen Huang, Tainan (TW); Wen-Tuo Huang, Tainan (TW); Ya-Chi Hung, Kaohsiung (TW); Chia-Sheng Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 641 days.

(21) Appl. No.: 17/738,290

(22) Filed: May 6, 2022

(65) Prior Publication Data

US 2023/0170249 A1  Jun. 1, 2023

Related U.S. Application Data

(60) Provisional application No. 63/284,178, filed on Nov. 30, 2021.

(51) Int. Cl.
*H01L 21/768* (2006.01)
*H01L 21/762* (2006.01)
(Continued)

(52) U.S. Cl.
CPC .. *H01L 21/76229* (2013.01); *H01L 21/76232* (2013.01); *H01L 23/481* (2013.01);
(Continued)

(58) Field of Classification Search
CPC ......... H01L 21/76229; H01L 21/76232; H01L 23/481; H01L 23/5226; H01L 23/585;
(Continued)

(56) References Cited

U.S. PATENT DOCUMENTS 9,972,603 B2    5/2018  Chu et al.
2007/0069364 A1*  3/2007  Kawano ................ H01L 23/481
                                                    438/584
(Continued)

FOREIGN PATENT DOCUMENTS

CN          109216268 A      9/2018

OTHER PUBLICATIONS

U.S. Appl. No. 17/471,666, filed Sep. 10, 2021.

*Primary Examiner* — Herve-Louis Y Assouman
(74) *Attorney, Agent, or Firm* — Eschweiler & Potashnik, LLC

(57) ABSTRACT

Various embodiments of the present disclosure are directed towards an integrated chip (IC). The IC includes a first deep trench isolation (DTI) structure in a substrate. A dielectric structure is over the substrate. An interconnect structure is in the dielectric structure. The interconnect structure includes a lower interconnect structure and an upper interconnect structure that are electrically coupled together. The upper interconnect structure includes a plurality of conductive plates. The plurality of conductive plates are vertically stacked and electrically coupled together. A back-side through substrate via (BTSV) is in the substrate and the dielectric structure. The BTSV extends from a conductive feature of the lower interconnect structure through the dielectric structure and the substrate. The conductive feature of the lower interconnect structure is at least partially laterally within a perimeter of the DTI structure. The BTSV is within the perimeter of the DTI structure.

20 Claims, 25 Drawing Sheets

(51) Int. Cl.
  *H01L 23/00*    (2006.01)
  *H01L 23/48*    (2006.01)
  *H01L 23/522*   (2006.01)
  *H01L 23/544*   (2006.01)
  *H01L 23/58*    (2006.01)
  *H01L 25/065*   (2023.01)
  *H10D 84/01*    (2025.01)
  *H10D 84/03*    (2025.01)

(52) U.S. Cl.
  CPC ..... *H01L 23/5226* (2013.01); *H10D 84/0151* (2025.01); *H10D 84/038* (2025.01)

(58) Field of Classification Search
  CPC . H01L 2223/54406; H01L 2223/54433; H01L 2223/54473; H01L 23/544; H01L 24/13; H01L 25/0657; H01L 21/76898; H10D 84/0151; H10D 84/038
  See application file for complete search history.

(56) References Cited

U.S. PATENT DOCUMENTS

| | | | |
|---|---|---|---|
| 2020/0373331 A1* | 11/2020 | Kim | ............... H10D 86/201 |
| 2021/0020545 A1* | 1/2021 | Kim | ............... H01L 21/76898 |
| 2021/0028112 A1* | 1/2021 | Kim | ............... H10D 84/038 |
| 2021/0351218 A1 | 11/2021 | Kuo et al. | |

\* cited by examiner

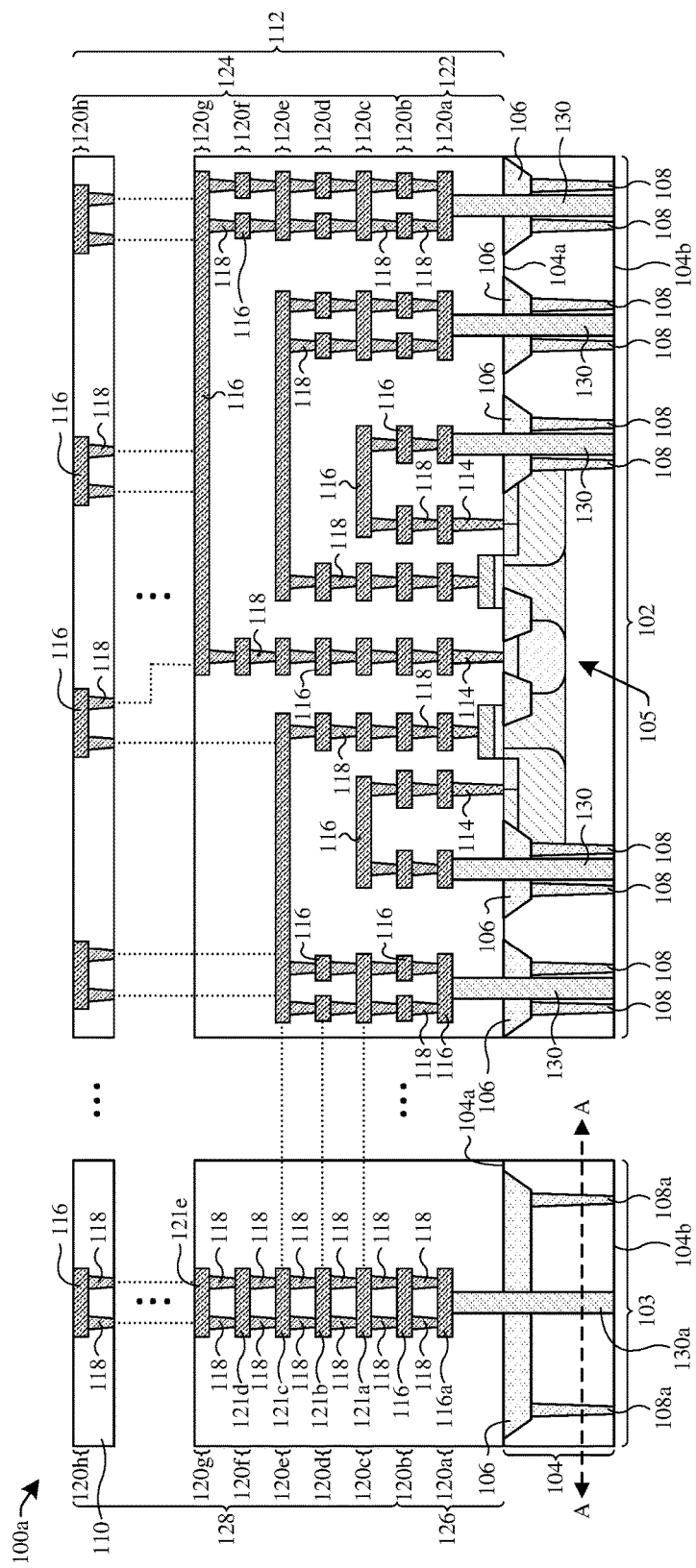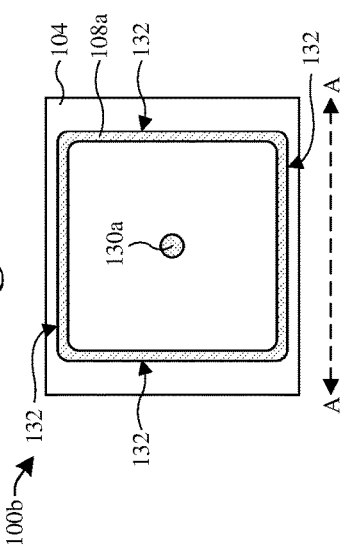
Fig. 1A
Fig. 1B

TESTING STRUCTURE FOR AN INTEGRATED CHIP HAVING A HIGH-VOLTAGE DEVICE

REFERENCE TO RELATED APPLICATIONS

This application claims the benefit of U.S. Provisional Application No. 63/284,178, filed on Nov. 30, 2021, the contents of which are hereby incorporated by reference in their entirety.

BACKGROUND

The semiconductor industry has continually improved the processing capabilities and power consumption of integrated chips (ICs) by shrinking the minimum feature size. However, in recent years, process limitations have made it difficult to continue shrinking the minimum feature size. The stacking of two-dimensional (2D) ICs into three-dimensional (3D) ICs via various 3D integration technologies has emerged as a potential approach to continue improving processing capabilities and power consumption. While 3D ICs provide many advantages, circuit probe (CP) testing of various 3D ICs can be challenging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1B illustrate various views of some embodiments of an integrated chip (IC) comprising a back-side through-substrate via (BTSV) electrically coupled to a conductive line of a first conductive layer of a plurality of conductive layers.

DETAILED DESCRIPTION

Figure 2:
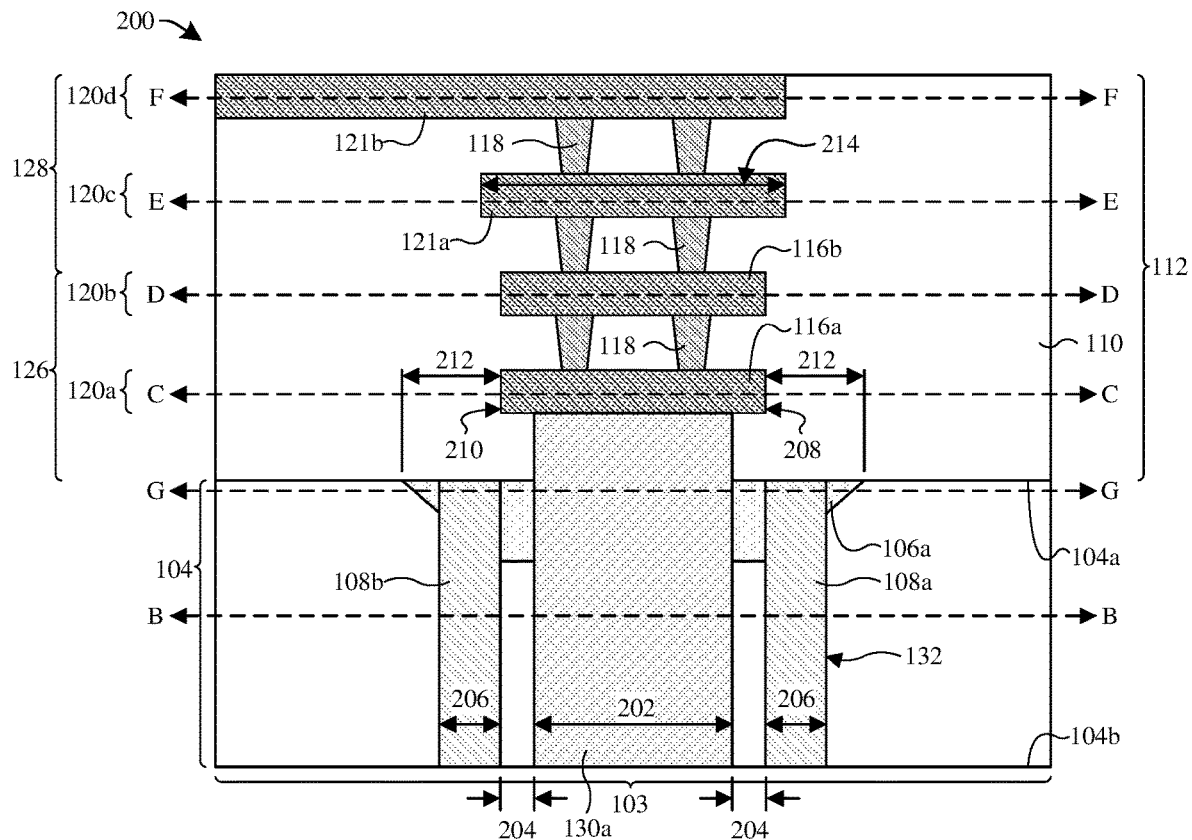
FIG. 2 illustrates a cross-sectional view of some embodiments of the IC of FIGS. 1A-1B.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Three-dimensional (3D) integration techniques (e.g., 3D wafer-level packaging, 2.5D and 3D interposer-based integration, 3D stacked ICs, monolithic 3D ICs, 3D heterogeneous integration, 3D systems integration, etc.) are often utilized to stack two-dimensional (2D) integrated chips (ICs) into a 3D IC. Some of these 3D ICs are formed via a bipolar-CMOS-DMOS (BCD) process. A 3D IC formed via the BCD process (BCD 3D IC) comprises high-voltage semiconductor devices (e.g., 100 V BCD device) and low-voltage semiconductor devices (e.g., logic metal-oxide-semiconductor field-effect transistors (MOSFETs), memory cells, etc.).

The semiconductor devices of the BCD 3D IC are disposed on a semiconductor substrate. A shallow trench isolation (STI) structure is disposed in the semiconductor substrate and laterally surround the semiconductor devices. An interconnect structure (e.g., copper interconnect) is disposed on a side of the semiconductor substrate and is embedded in an interlayer dielectric (ILD) structure. The interconnect structure electrically couples the semiconductor devices of the BCD 3D IC together in a predefined manner.

The interconnect structure comprises a plurality of conductive lines (e.g., metal wires) and a plurality of conductive vias (e.g., metal vias). The plurality of conductive lines are disposed in a plurality of conductive layers (e.g., metal layer 1, metal layer 2, etc.). The plurality of conductive layers are vertically stacked. The plurality of conductive layers extend laterally through the ILD structure and are electrically coupled together via various conductive vias of the plurality of conductive vias. Typically, the plurality of conductive layers are consecutively numbered in a vertical manner starting from the conductive layer of the plurality of conductive layers that is disposed nearest the semiconductor substrate. For example, the conductive layer of the plurality of conductive layers that is disposed nearest the semiconductor substrate is referred to as a first conductive layer (e.g., metal layer 1), the next closest conductive layer of the plurality of conductive layers is referred to as a second conductive layer (e.g., metal layer 2), the next closest conductive layer of the plurality of conductive layers is referred to as a third conductive layer (e.g., metal layer 3), and so forth.

Due to the high-voltage devices of the BCD 3D IC, a typical BCD 3D IC interconnect structure may not have functional conductive lines in the first conductive layer (metal layer 1) or the second conductive layer (metal layer 2) that overlie the STI structure (e.g., due to the high voltage (e.g., 100 V) that must be withstood in the conductive lines of the interconnect structure). Because the interconnect structure may not have functional conductive lines in the first conductive layer (metal layer 1) and/or the second conductive layer (metal layer 2), the BCD 3D IC may not have back-side through-substrate vias (BTSVs) (e.g., the process for forming BTSVs has been incompatible with BCD 3D ICs) that are utilized for electronic testing purposes (e.g., circuit probe testing). As such, electronic testing (e.g., wafer testing) of BCD 3D ICs has been limited, which may reduce yield and/or increase the cost to fabricate BCD 3D ICs.

Various embodiments of the present disclosure are directed toward an integrated chip (IC) (e.g., a BCD 3D IC) comprising a ring-shaped deep trench isolation (DTI) structure disposed in a semiconductor substrate. A dielectric structure is disposed over semiconductor substrate. A conductive interconnect structure is disposed in the dielectric structure. The conductive interconnect structure comprises a lower conductive interconnect structure that is at least partially laterally disposed within a perimeter of the ring-shaped DTI structure. The conductive interconnect structure comprises an upper conductive interconnect structure that overlies and is electrically coupled to the lower conductive interconnect structure. A back-side through substrate via (BTSV) is disposed in the semiconductor substrate and the dielectric structure. The BTSV extends from a first conductive feature of the lower conductive interconnect structure through both the dielectric structure and the semiconductor substrate. The first conductive feature of the lower conductive interconnect structure is disposed in a first conductive layer (e.g., metal layer 1). The BTSV is disposed within the perimeter of the first ring-shaped DTI structure. Because the BTSV is disposed within the perimeter of the first ring-shaped DTI structure, the BTSV may be electrically coupled to the first conductive feature of the lower conductive interconnect structure (e.g., the BTSV may be electrically coupled to a conductive line/island of metal layer 1). Thus, the BTSV may be utilized for electronic testing purposes (e.g., circuit probe testing). Accordingly, electronic testing (e.g., wafer testing) of BCD 3D ICs may be improved, which may increase yield and/or decrease the cost to fabricate BCD 3D ICs.

FIGS. 1A-1B illustrate various views 100a-100b of some embodiments of an integrated chip (IC) comprising a back-side through-substrate via (BTSV) electrically coupled to a conductive line of a first conductive layer of a plurality of conductive layers. More specifically, FIG. 1A illustrates a cross-sectional view 100a of some embodiments of an IC comprising a BTSV electrically coupled to a conductive line of a first conductive layer of a plurality of conductive layers. FIG. 1B illustrates a cross-sectional view 100b of the IC of FIG. 1A taken along line A-A of FIG. 1A.

As shown in the various views 100a-100b of FIGS. 1A-1B, the IC comprises a device region 102 and a testing region 103. The IC comprises a substrate 104 disposed in the device region 102 and the testing region 103. A semiconductor device 105 (e.g., high-voltage BCD device, such as a 100 volt (V) laterally-diffused metal-oxide semiconductor (LDMOS) device) is disposed on the substrate 104. A plurality of shallow trench isolation (STI) structures 106 are disposed in the substrate 104. The plurality of STI structures 106 are disposed in the device region 102 and the testing region 103. A plurality of deep trench isolation (DTI) structures 108 are disposed in the substrate 104. The plurality of DTI structures 108 are disposed in the device region 102 and the testing region 103. The plurality of DTI structures 108 comprises a first ring-shaped DTI structure 108a disposed in the testing region 103.

An interlayer dielectric (ILD) structure 110 is disposed over the substrate 104 and the semiconductor device 105. The substrate 104 has a first surface 104a (e.g., front-side surface) and a second surface 104b (e.g., back-side surface) opposite the first surface 104a. The ILD structure 110 is disposed in the device region 102 and the testing region 103. A conductive interconnect structure 112 (e.g., copper interconnect) is disposed over the substrate 104 and in the ILD structure 110. The conductive interconnect structure 112 is disposed in the device region 102 and the testing region 103. The conductive interconnect structure 112 comprises a plurality of conductive contacts 114 (e.g., metal contacts), a plurality of conductive lines 116 (e.g., metal wires), and a plurality of conductive vias 118 (e.g., metal vias). The conductive interconnect structure 112 is electrically coupled to the semiconductor device 105. The conductive interconnect structure 112 electrically couples the semiconductor device 105 to other semiconductor devices of the IC (not shown) in a predefined manner. In some embodiments, the plurality of conductive contacts 114, the plurality of conductive lines 116, and/or the plurality of conductive vias 118 may be or comprise, for example, copper (Cu), aluminum (Al), tungsten (W), gold (Au), silver (Ag), platinum (Pt), some other conductive material, or a combination of the foregoing.

The plurality of conductive lines 116 are disposed in a plurality of conductive layers 120 (e.g., metal layers). Each of the plurality of conductive layers 120 extend laterally through the ILD structure 110 along a corresponding lateral plane. Each of the plurality of conductive layers 120 comprises a group of one or more of the plurality of conductive lines 116. The plurality of conductive layers 120 are disposed over one another. The plurality of conductive vias 118 extend vertically between the plurality of conductive layers 120 and electrically couple the plurality of conductive lines 116 of the plurality of conductive layers 120 together in a predefined manner.

For example, the plurality of conductive layers 120 comprises a first conductive layer 120a (e.g., metal layer 1), a second conductive layer 120b (e.g., metal layer 2), a third conductive layer 120c (e.g., metal layer 3), a fourth conductive layer 120d (e.g., metal layer 4), a fifth conductive layer 120e (e.g., metal layer 5), a sixth conductive layer 120f (e.g., metal layer 6), and a seventh conductive layer 120g (e.g., metal layer 7) disposed in the ILD structure 110. The plurality of conductive layers 120 also comprises an uppermost conductive layer 120h (e.g., top metal layer).

The first conductive layer 120a comprises a first group of conductive lines of the plurality of conductive lines 116, the second conductive layer 120b comprises a second group of conductive lines of the plurality of conductive lines 116, the third conductive layer 120c comprises a third group of conductive lines of the plurality of conductive lines 116, the fourth conductive layer 120d comprises a fourth group of conductive lines of the plurality of conductive lines 116, the fifth conductive layer 120e comprises a fifth group of conductive lines of the plurality of conductive lines 116, the sixth conductive layer 120f comprises a sixth group of conductive lines of the plurality of conductive lines 116, and the seventh conductive layer 120g comprises a seventh group of conductive lines of the plurality of conductive lines 116. The first group of conductive lines are disposed along a first lateral plane that extends in parallel with the first surface 104a of the substrate 104, the second group of conductive lines are disposed along a second lateral plane that extends in parallel with the first lateral plane, the third group of conductive lines are disposed along a third lateral plane that extends in parallel with the second lateral plane, the fourth group of conductive lines are disposed along a fourth lateral plane that extends in parallel with the third lateral plane, the fifth group of conductive lines are disposed along a fifth lateral plane that extends in parallel with the fourth lateral plane, the sixth group of conductive lines are disposed along a sixth lateral plane that extends in parallel with the fifth lateral plane, and the seventh group of conductive lines are disposed along a seventh lateral plane that extends in parallel with the sixth lateral plane. The uppermost conductive layer 120h comprises an eighth group of conductive lines of the plurality of conductive lines 116 that is the uppermost group of conductive lines of the plurality of conductive lines 116. The eighth group of conductive lines are disposed along an eighth lateral plane that extends in parallel with the seventh lateral plane.

The second conductive layer 120b is disposed over the first conductive layer 120a, the third conductive layer 120c is disposed over the second conductive layer 120b, the fourth conductive layer 120d is disposed over the third conductive layer 120c, the fifth conductive layer 120e is disposed over the fourth conductive layer 120d, the sixth conductive layer 120f is disposed over the fifth conductive layer 120e, and the seventh conductive layer 120g is disposed over the sixth conductive layer 120f. The uppermost conductive layer 120h is disposed over every other conductive layer of the plurality of conductive layers 120. The first conductive layer 120a is disposed nearer the substrate 104 than any other of the plurality of conductive layers 120. It will be appreciated that the plurality of conductive layers 120 is not limited to eight conductive layers, but rather the plurality of conductive layers 120 may comprise any suitable number of conductive layers. It will also be appreciated that the uppermost conductive layer 120h (e.g., the conductive lines of the uppermost conductive layer 120h) is electrically coupled to the underlying conductive layers (e.g., the conductive lines of the seventh conductive layer 120g, the conductive lines of the sixth conductive layer 120f, the conductive lines of the fifth conductive layer 120e, and so forth), which is illustrated by dotted lines in FIG. 1A.

The conductive interconnect structure 112 also comprises a plurality of conductive plates 121 disposed in the testing region 103. The plurality of conductive plates 121 are vertically stacked. For example, the plurality of conductive plates 121 comprises a first conductive plate 121a, a second conductive plate 121b, a third conductive plate 121c, a fourth conductive plate 121d, and a fifth conductive plate 121e. The second conductive plate 121b overlies the first conductive plate 121a, the third conductive plate 121c overlies the second conductive plate 121b, the fourth conductive plate 121d overlies the third conductive plate 121c, and the fifth conductive plate 121e overlies the fourth conductive plate 121d. The plurality of conductive plates 121 are electrically coupled together. Conductive vias of the plurality of conductive vias 118 that are disposed in the testing region 103 electrically coupled the plurality of conductive plates 121 together.

The third conductive layer 120c comprises the first conductive plate 121a, and the first conductive plate 121a is disposed along the third lateral plane. The fourth conductive layer 120d comprises the second conductive plate 121b, and the second conductive plate 121b is disposed along the fourth lateral plane. The fifth conductive layer 120e comprises the third conductive plate 121c, and the third conductive plate 121c is disposed along the fifth lateral plane. The sixth conductive layer 120f comprises the fourth conductive plate 121d, and the fourth conductive plate 121d is disposed along the sixth lateral plane. The seventh conductive layer 120g comprises the fifth conductive plate 121e, and the fifth conductive plate 121e is disposed along the seventh lateral plane. It will be appreciated that the plurality of conductive plates 121 is not limited to five vertically stacked conductive plate, but rather the plurality of conductive plates 121 may comprise any suitable number of vertically stacked conductive plates.

It will also be appreciated that the plurality of conductive plates 121 may be electrically coupled to one or more conductive lines of the uppermost conductive layer 120h, which is illustrated by dotted lines in FIG. 1A. While FIG. 1A illustrates a conductive line of the uppermost conductive layer 120h disposed over and electrically coupled to the plurality of conductive plates 121, it will be appreciated that, in other embodiments, the plurality of conductive plates 121 may be vertically stacked to the uppermost conductive layer 120h. In other words, the plurality of conductive plates 121 comprises a sixth conductive plate (not shown) that overlies the fifth conductive plate 121e, and the uppermost conductive layer 120h comprises the sixth conductive plate. In further embodiments, the sixth conductive plate may be a test pad (e.g., a probe pad configured to have a test probe placed thereon during a wafer testing process).

The conductive interconnect structure 112 comprises a first lower conductive interconnect structure 122 disposed in the device region 102. The first lower conductive interconnect structure 122 comprises the plurality of conductive contacts 114 disposed in the device region 102, the conductive lines of the first group of conductive lines disposed in the device region 102, and the conductive lines of the second group of conductive lines disposed in the device region 102. The plurality of conductive contacts 114 extend vertically from the substrate 104 to the conductive lines of the first group of conductive lines. The plurality of conductive contacts 114 electrically couple the semiconductor device 105 to the conductive lines of the first group of conductive lines. The first lower conductive interconnect structure 122 also comprises the conductive vias of the plurality of conductive vias 118 that are disposed in the device region 102 and extend vertically between the conductive lines of the first lower conductive interconnect structure 122.

The conductive interconnect structure 112 comprises a first upper conductive interconnect structure 124 disposed in the device region 102. The first upper conductive interconnect structure 124 is disposed over the first lower conductive interconnect structure 122. The first upper conductive interconnect structure 124 is electrically coupled to the first lower conductive interconnect structure 122. The first upper conductive interconnect structure 124 comprises the conductive lines of the plurality of conductive lines 116 that are disposed in the device region 102 and that are disposed over the second conductive layer 120b. The first upper conductive interconnect structure 124 also comprises the conductive vias of the plurality of conductive vias 118 that are disposed in the device region 102 and that extend vertically between the conductive lines of the first upper conductive interconnect structure 124. The first lower conductive interconnect structure 122 is electrically coupled to the first upper conductive interconnect structure 124.

The conductive interconnect structure 112 comprises a second lower conductive interconnect structure 126 disposed in the testing region 103. The second lower conductive interconnect structure 126 comprises the conductive lines of the first group of conductive lines disposed in the testing region 103 and the conductive lines of the second group of conductive lines disposed in the testing region 103. The second lower conductive interconnect structure 126 also comprises the conductive vias of the plurality of conductive vias 118 that are disposed in the testing region 103 and extend vertically between the conductive lines of the second lower conductive interconnect structure 126.

The conductive interconnect structure 112 also comprises a second upper conductive interconnect structure 128 disposed in the testing region 103. The second upper conductive interconnect structure 128 is disposed over the second lower conductive interconnect structure 126. The second upper conductive interconnect structure 128 is electrically coupled to the second lower conductive interconnect structure 126. The second upper conductive interconnect structure 128 is electrically coupled to the first upper conductive interconnect structure 124. Thus, in some embodiments, the first lower conductive interconnect structure 122 may be electrically coupled to the second upper conductive interconnect structure 128 and/or the second lower conductive interconnect structure 126. In some embodiments, the second upper conductive interconnect structure 128 is electrically coupled to the first upper conductive interconnect structure 124 via (e.g., via only) one or more conductive lines that are disposed above the second conductive layer 120b (e.g., the conductive lines of the third conductive layer 120c, the conductive lines of the fourth conductive layer 120d, the conductive lines of the fifth conductive layer 120e, and so forth).

The second upper conductive interconnect structure 128 comprises the plurality of conductive plates 121. Further, the second upper conductive interconnect structure 128 comprises the conductive vias of the plurality of conductive vias 118 that are disposed in the testing region 103 and that electrically couple the plurality of conductive plates 121 together. Moreover, in some embodiments, the second upper conductive interconnect structure 128 comprises any conductive lines of the plurality of conductive lines 116 that are disposed in the testing region 103 and that are disposed over the plurality of conductive plates 121 (e.g., the one or more conductive lines of the uppermost conductive layer 120h disposed in the testing region 103).

A plurality of back-side through-substrate via (BTSVs) 130 are disposed in the substrate 104 and the ILD structure 110. The plurality of BTSVs 130 are electrically coupled to corresponding conductive lines of the first conductive layer 120a. The plurality of BTSVs 130 protrude from their corresponding conductive lines through the ILD structure 110 and the substrate 104. For example, a first BTSV 130a of the plurality of BTSVs 130 is disposed in the substrate 104 and the ILD structure 110. The first BTSV 130a is electrically coupled to a first conductive line 116a (e.g., a conductive island). The first conductive line 116a is disposed in the testing region 103 and is one of the conductive lines of the first conductive layer 120a. The first BTSV 130a protrudes from the first conductive line 116a through the ILD structure 110 and the substrate 104.

The plurality of DTI structures 108 comprises a first ring-shaped DTI structure 108a disposed in the substrate 104 and in the testing region 103. The first ring-shaped DTI structure 108a extends laterally through the substrate 104 and laterally around the first BTSV 130a in a closed loop path. The first BTSV 130a is disposed laterally within a first perimeter 132 (e.g., outer perimeter) of the first ring-shaped DTI structure 108a, as shown in the cross-sectional view 100b of FIG. 1B. The first conductive line 116a is disposed at least partially laterally within the first ring-shaped DTI structure 108a.

Because the first BTSV 130a is disposed within the first perimeter 132 of the first ring-shaped DTI structure 108a, the first BTSV 130a may be electrically coupled to the first conductive line 116a (e.g., a first conductive island) of the second lower conductive interconnect structure 126 (e.g., the first BTSV 130a may be electrically coupled to a conductive line/island of metal layer 1). Thus, the first BTSV 130a may be utilized for electronic testing purposes (e.g., the plurality of BTSVs 130 may be utilized as probe pads that are electrically coupled to the plurality of conductive plates 121, which are part of a testing structure utilized to test the semiconductor devices of the IC during fabrication). Accordingly, electronic testing (e.g., wafer testing) of the IC may be improved, which may increase yield and/or decrease the cost to fabricate the IC.

FIG. 2 illustrates a cross-sectional view 200 of some embodiments of the IC of FIGS. 1A-1B.

As shown in the cross-sectional view 200 of FIG. 2, the plurality of STI structures 106 comprises a first STI structure 106a disposed in the substrate 104 and in the testing region 103. The plurality of STI structures 106 may have angled sidewalls. In other embodiments, the sidewalls of the plurality of STI structures 106 may be substantially straight (e.g., vertical). In some embodiments, the plurality of STI structures 106 may be or comprise, for example, an oxide (e.g., silicon dioxide ($SiO_2$)), a nitride (e.g., silicon nitride (SiN)), an oxy-nitride (e.g., silicon oxy-nitride (SiON)), a carbide (e.g., silicon carbide (SiC)), some other dielectric material, or a combination of the foregoing.

The first BTSV 130a extends from (e.g., extends vertically from) the first conductive line 116a and penetrates the ILD structure 110, the substrate 104, and the first STI structure 106a. The first BTSV 130a extends through (e.g., extends vertically through) the first STI structure 106a, the substrate 104, and the ILD structure 110. In some embodiments, the plurality of BTSVs 130 have substantially straight sidewalls. In other embodiments, the sidewalls of the plurality of BTSVs 130 may be angled. In some embodiments, the plurality of BTSVs 130 may be or comprise, for example, copper (Cu), tantalum nitride (TaN), aluminum (Al), gold (Au), silver (Ag), platinum (Pt), or the like.

The substrate 104 comprises any type of semiconductor body (e.g., monocrystalline silicon/CMOS bulk, germanium (Ge), silicon-germanium (SiGe), a III-V semiconductor, semiconductor-on-insulator (SOI), etc.). In some embodiments, the substrate 104 may be a semiconductor-on-insulator (SOI) substrate (e.g., silicon-on-insulator). The ILD structure 110 comprises one or more stacked ILD layers, which may respectively comprise a low-k dielectric (e.g., a dielectric material with a dielectric constant less than about 3.9), an oxide (e.g., $SiO_2$), a nitride (e.g., SiN), an oxy-nitride (e.g., SiON), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), a spin-on glass (SOG), or the like. The plurality of conductive layers 120 are disposed in the stacked ILD layers, respectively.

In some embodiments, the plurality of DTI structures 108 comprise the first ring-shaped DTI structure 108a and a second ring-shaped DTI structure 108b. The second ring-shaped DTI structure 108b is disposed in the testing region 103 and laterally within the first perimeter 132 of the first ring-shaped DTI structure 108a. In some embodiments, the plurality of DTI structures 108 extend vertically through the plurality of STI structures 106. For example, the first ring-shaped DTI structure 108a and the second ring-shaped DTI structure 108b may both extend vertically through the first STI structure 106a. In some embodiments, the plurality of DTI structures 108 have substantially straight sidewalls. In other embodiments, the sidewalls of the plurality of DTI structures 108 may be angled. In some embodiments, the plurality of DTI structures 108 may be or comprise, for example, an oxide (e.g., $SiO_2$), a nitride (e.g., SiN), an oxy-nitride (e.g., SiON), a carbide (e.g., SiC), some other dielectric material, or a combination of the foregoing.

The first conductive line 116a is vertically spaced from the substrate 104. In other words, a lower surface of the first conductive line 116a is vertically spaced from the first surface 104a (e.g., an upper surface) of the substrate 104.

Also shown in the cross-sectional view 200 of FIG. 2, the second lower conductive interconnect structure 126 comprises a second conductive line 116b (e.g., a second conductive island). The second conductive line 116b is disposed in the testing region 103 and is one of the conductive lines of the second conductive layer 120b. The second conductive line 116b overlies and is electrically coupled to the first conductive line 116a. In some embodiments, two or more conductive vias extend vertically between the first conductive line 116a and the second conductive line 116b. In some embodiments, two or more conductive vias extend vertically between the second conductive line 116b and the first conductive plate 121a. In some embodiments, two or more conductive vias extend vertically between the first conductive plate 121a and the second conductive plate 121b. In some embodiments, the plurality of conductive plates 121 may be or comprise, for example, copper (Cu), aluminum (Al), tungsten (W), gold (Au), silver (Ag), platinum (Pt), some other conductive material, or a combination of the foregoing.

In some embodiments, the second lower conductive interconnect structure 126 consists of a set number of conductive lines and conductive vias. In such embodiments, the set number of conductive lines and conductive vias may be made up of conductive lines of the plurality of conductive lines 116 and conductive vias of the plurality of conductive vias 118 that are disposed within (e.g., completely within) the testing region 103. In further such embodiments, the set number of conductive lines and conductive vias may be made up of conductive lines of the plurality of conductive lines 116 and conductive vias of the plurality of conductive vias 118 that are disposed within (e.g., completely within) the first perimeter 132 of the first ring-shaped DTI structure 108a.

For example, the first conductive line 116a may be disposed within (e.g., completely within) the testing region 103 and/or the first perimeter 132 of the first ring-shaped DTI structure 108a. Thus, the first conductive line 116a is one of the set number of conductive lines. In some embodiments, no other conductive lines and no other conductive vias of the set number of conductive lines and conductive vias are disposed vertically between the first conductive line 116a and the substrate 104. In further embodiments, no other conductive lines and no other conductive vias of the set number of conductive lines and conductive vias are disposed nearer the substrate 104 than the first conductive line 116a.

The first BTSVs 130a has a width 202. The width 202 may be greater than about 2.5 micrometer (μm) (e.g., about 2.5 μm comprises small variations due to fabrication processes). In some embodiments, the width 202 may be about 3.2 μm. The first BTSV 130a is laterally spaced from the first ring-shaped DTI structure 108a and the second ring-shaped DTI structure 108b by a first distance 204. The first distance 204 may be between about 0.5 μm and about 1.0 μm. For example, in some embodiments, the first distance 204 is about 0.56 μm. It will be appreciated that, in some embodiments, each of the plurality of BTSVs 130 have the width 202 and are spaced from corresponding DTI structures by the first distance 204.

The first ring-shaped DTI structure 108a and the second ring-shaped DTI structure 108b has a width 206. The width 206 may be between about 0.6 μm and about 1.2 μm. For example, in some embodiments, the width 206 is about 1 μm. It will be appreciated that, in some embodiments, each of the plurality of DTI structures 108 have the width 206.

The first conductive line 116a has a first sidewall 208 and a second sidewall 210 opposite the first sidewall 208. The first sidewall 208 and the second sidewall 210 of the first conductive line 116a are laterally spaced from an outer perimeter of the first STI structure 106a by a second distance 212. The second distance 212 may be greater than about 1.5 μm.

The first conductive plate 121a has a width 214. In some embodiments, the width 214 is greater than a width of the first conductive line 116a and/or a width of the second conductive line 116b. In further embodiments, the width 214 is greater than about 3.5 μm. For example, in some embodiments, the width 214 is about 5 μm. In some embodiments, the width 202, the first distance 204, the width 206, the second distance 212, and/or the width 214 are less than 90% of similar dimensions in a typical IC (e.g., in a BCD 3D IC that utilizes a different type of structure for circuit probe testing may take up 9 times more space on the BCD 3D IC).

Figure 3A:
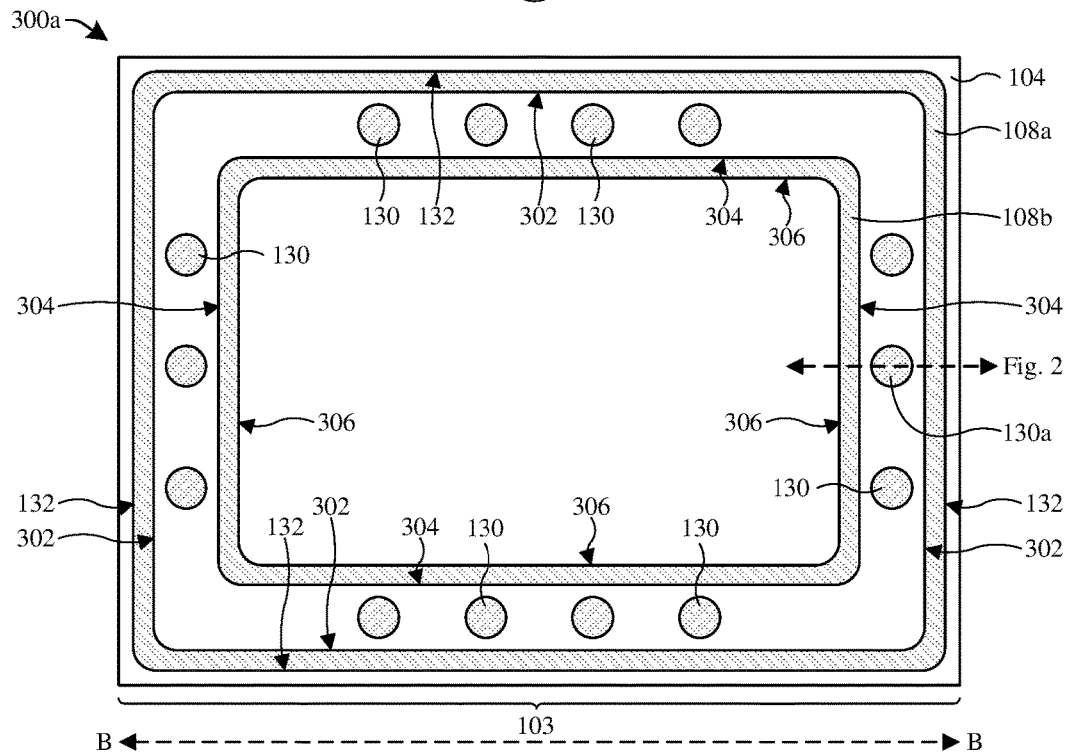
FIGS. 3A-3F illustrate various cross-sectional views of some embodiments of the IC of FIG. 2.
Figure 3B:
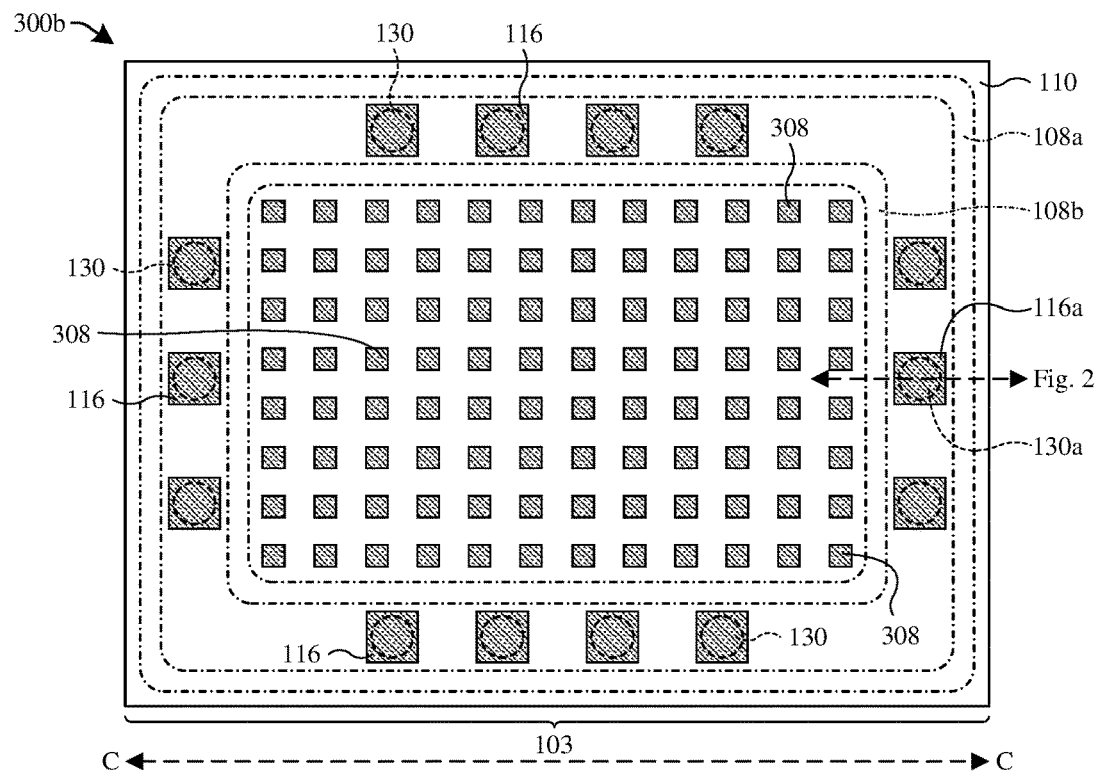
Figure 3C:
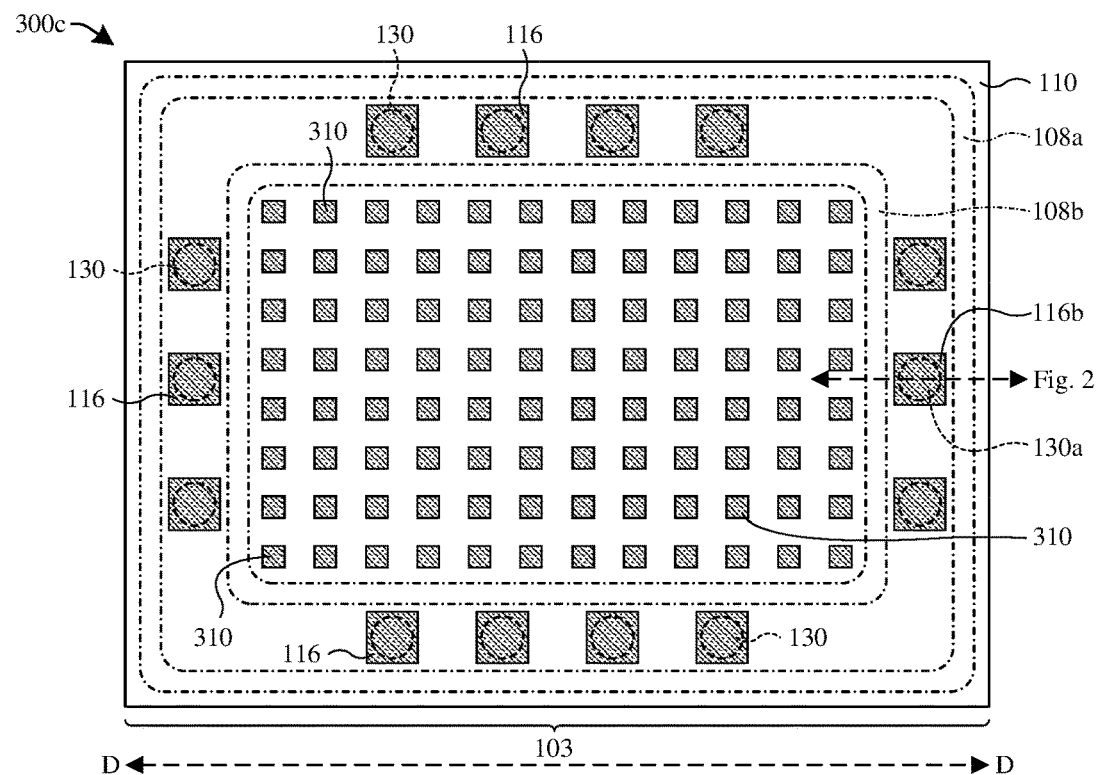
Figure 3D:
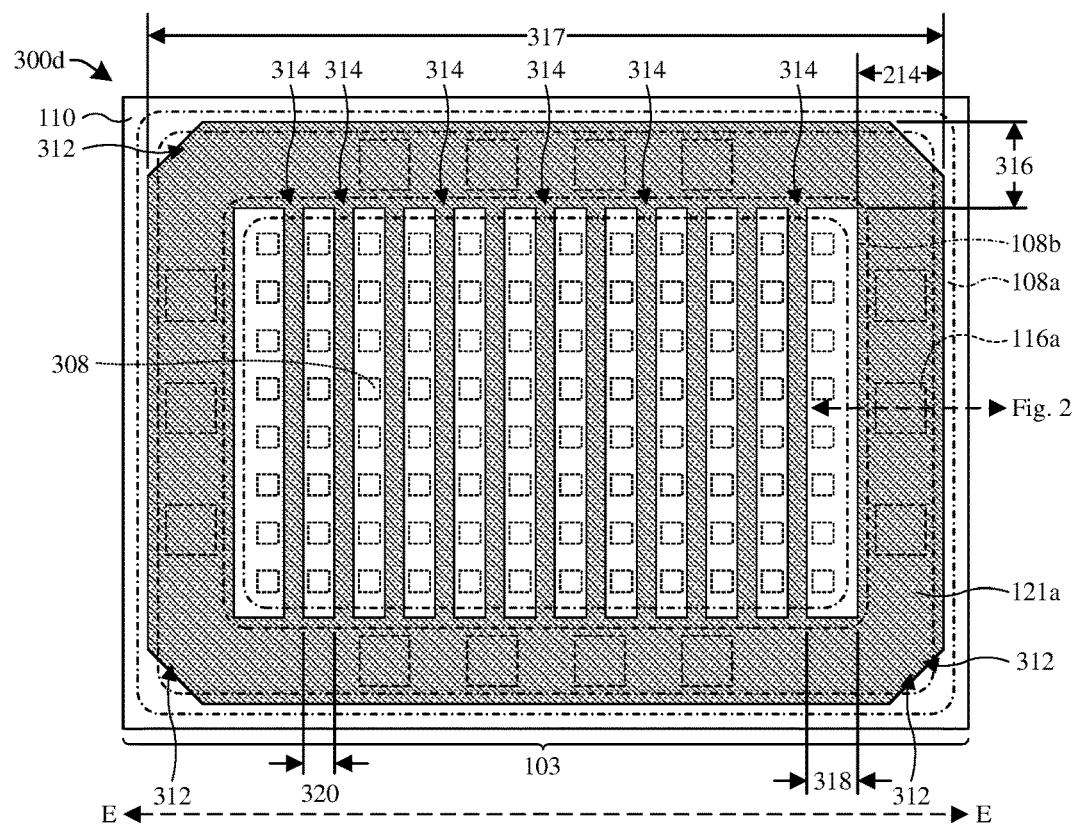
Figure 3E:
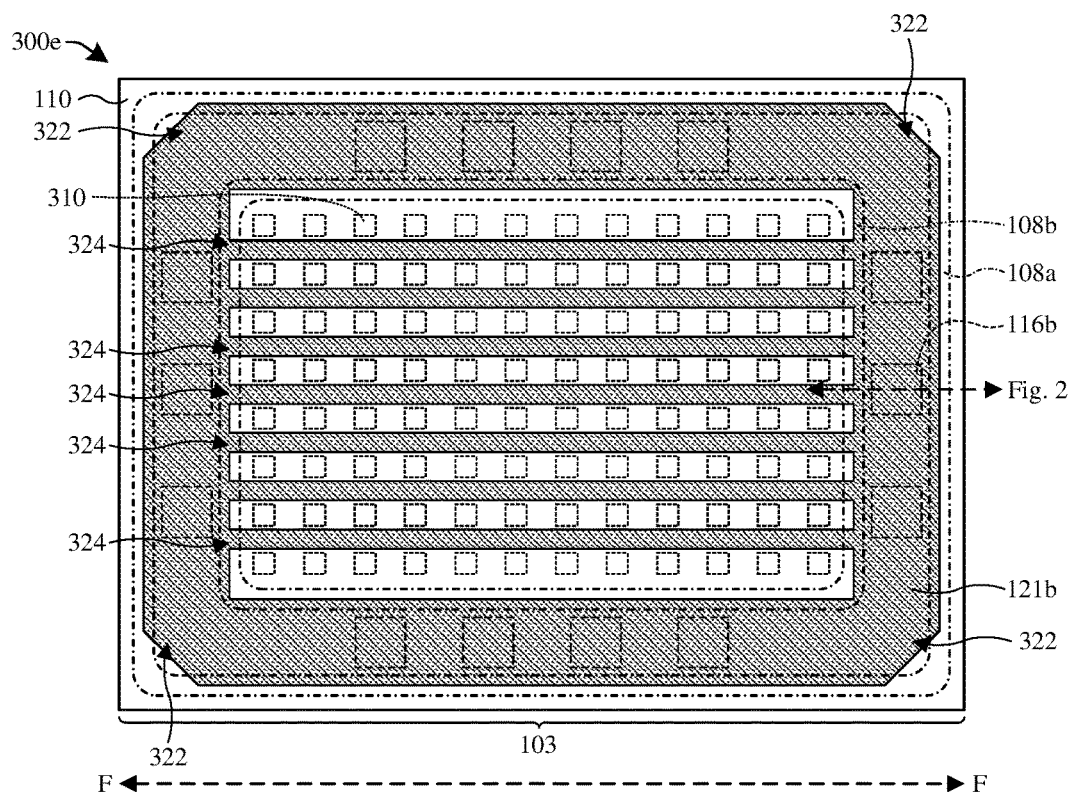
Figure 3F:
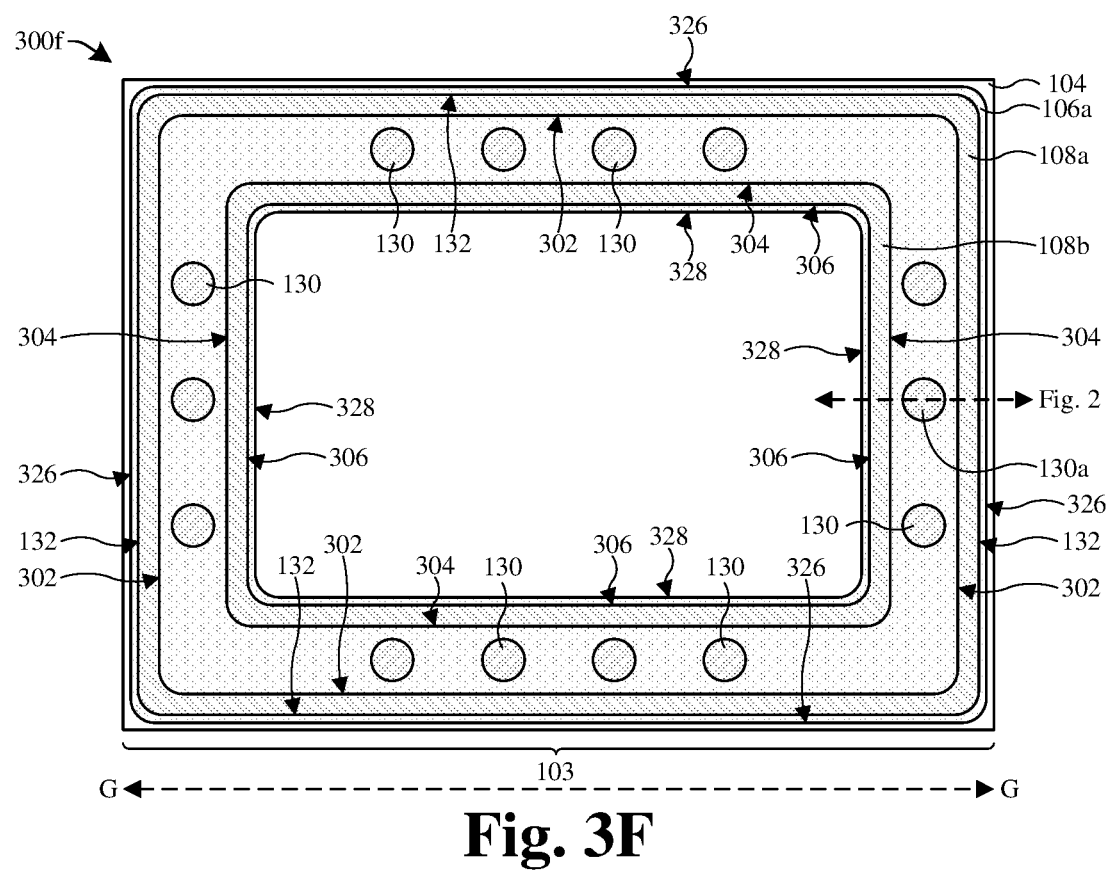

FIGS. 3A-3F illustrate various cross-sectional views 300a-300f of some embodiments of the IC of FIG. 2. More specifically, FIG. 3A illustrates a cross-sectional view 300a of an embodiment of the IC of FIG. 2 taken along line B-B of FIG. 2. FIG. 3B illustrates a cross-sectional view 300b of the embodiment of the IC of FIG. 2 taken along line C-C of FIG. 2. FIG. 3C illustrates a cross-sectional view 300c of the embodiment of the IC of FIG. 2 taken along line D-D of FIG. 2. FIG. 3D illustrates a cross-sectional view 300d of the embodiment of the IC of FIG. 2 taken along line E-E of FIG. 2. FIG. 3E illustrates a cross-sectional view 300e of the embodiment of the IC of FIG. 2 taken along line F-F of FIG. 2. FIG. 3F illustrates a cross-sectional view 300f of the embodiment of the IC of FIG. 2 taken along line G-G of FIG. 2. For additional context, each of the various cross-sectional views 300a-300f of FIG. 3A-3F includes a dotted line (labeled "FIG. 2") that corresponds to the cross-sectional view illustrated in FIG. 2.

As shown in the cross-sectional view 300a of FIG. 3A, the first ring-shaped DTI structure 108a has the first perimeter 132 (e.g., outer perimeter) and a second perimeter 302 (e.g., inner perimeter). The second ring-shaped DTI structure 108b is disposed within both the first perimeter 132 and the second perimeter 302 of the first ring-shaped DTI structure 108a. The second ring-shaped DTI structure 108b extend laterally through the substrate 104 in a closed loop path. The second ring-shaped DTI structure 108b also has a first perimeter 304 (e.g., outer perimeter) and a second perimeter 306 (e.g., inner perimeter). The BTSVs of the plurality of BTSVs 130 that are disposed in the testing region 103 are disposed laterally between the first perimeter 132 of the first ring-shaped DTI structure 108a and the second perimeter 306 of the second ring-shaped DTI structure 108b. In some embodiments, the BTSVs of the plurality of BTSVs 130 that are disposed in the testing region 103 are disposed laterally between the second perimeter 302 of the first ring-shaped DTI structure 108a and the first perimeter 304 of the second ring-shaped DTI structure 108b. For example, the first BTSV 130a is disposed laterally between the second perimeter 302 of the first ring-shaped DTI structure 108a and the first perimeter 304 of the second ring-shaped DTI structure 108b. It will be appreciated that, in some embodiments, each of the BTSVs of the plurality of BTSVs 130 that are disposed in the testing region 103 have substantially similar features (e.g., structural features) as the first BTSV 130a. For example, each of the BTSVs of the plurality of BTSVs 130 that are disposed in the testing region 103 extend from a corresponding one of the conductive lines of the first conductive layer 120a vertically through both the ILD structure 110 and the substrate 104.

Also shown in the cross-sectional view 300a of FIG. 3A, the corners (e.g., the inside and outside corners) of the first ring-shaped DTI structure 108a are rounded. In some embodiments, if the corners of the first ring-shaped DTI structure 108a are sharp corners, the sharp corners of the first ring-shaped DTI structure 108a may causes high electric field areas in the substrate 104 (e.g., the sharp corners may increase defects which may causes charges to unsatisfactory accumulate near the sharp corners), which may negatively impact the testing of and/or the performance of the IC. The corners (e.g., the inside and outside corners) of the second ring-shaped DTI structure 108b are also rounded. In some embodiments, if the corners of the second ring-shaped DTI structure 108b are sharp corners, the sharp corners of the second ring-shaped DTI structure 108b may further cause high electric field areas in the substrate 104, which may negatively impact the testing of and/or the performance of the IC.

As shown in the cross-sectional view 300b of FIG. 3B, the first conductive line 116a overlies and is electrically coupled to the first BTSV 130a. In some embodiments, a perimeter of the first BTSV 130a is disposed laterally within a perimeter of the first conductive line 116a. For additional context, the plurality of BTSVs 130, the first ring-shaped DTI structure 108a, and the second ring-shaped DTI structure 108b are illustrated in phantom in FIG. 3B. The first conductive line 116a is disposed at least partially laterally within the first perimeter 132 of the first ring-shaped DTI structure 108a. In some embodiments, the first conductive line 116a is disposed at least partially laterally between the first perimeter 132 of the first ring-shaped DTI structure 108a and the second perimeter 306 of the second ring-shaped DTI structure 108b. In further embodiments, the first conductive line 116a is disposed at least partially laterally between the second perimeter 302 of the first ring-shaped DTI structure 108a and the first perimeter 304 of the second ring-shaped DTI structure 108b.

In some embodiments, the perimeter of the first conductive line 116a is disposed laterally between the first perimeter 132 of the first ring-shaped DTI structure 108a and the second perimeter 306 of the second ring-shaped DTI structure 108b. In further embodiments, the perimeter of the first conductive line 116a is disposed laterally between the second perimeter 302 of the first ring-shaped DTI structure 108a and the first perimeter 304 of the second ring-shaped DTI structure 108b. In some embodiments, the perimeter of the first conductive line 116a has a square-like shape. In further embodiments, the first conductive line 116a may be referred to as a first conductive island (e.g., due to the island-like shape of the first conductive line). It will be appreciated that the first conductive line 116a is one of a collection of conductive lines of the first conductive layer 120a that are disposed in the second lower conductive interconnect structure 126 (see, FIG. 2). It will also be appreciated that each of the conductive lines of the collection of conductive lines of the first conductive layer 120a may have substantially similar features (e.g., structural features) as the first conductive line 116a. For example, each of the conductive lines of the collection of conductive lines overlie and are electrically coupled to a corresponding BTSV of the plurality of BTSVs 130.

Also shown in the cross-sectional view 300b of FIG. 3B, the second lower conductive interconnect structure 126 comprises a plurality of first dummy structures 308 disposed in the ILD structure 110. The first conductive layer 120a comprises the plurality of first dummy structures 308. The plurality of first dummy structures 308 are disposed along the first lateral plane. In some embodiments, the plurality of first dummy structures 308 may be or comprise, for example, copper (Cu), aluminum (Al), tungsten (W), gold (Au), silver (Ag), platinum (Pt), some other conductive material, or a combination of the foregoing. In further embodiments, the plurality of first dummy structures 308 have a same chemical composition as the first conductive line 116a. The plurality of first dummy structures 308 are configured to reduce dishing during formation of the ILD structure 110.

The plurality of first dummy structures 308 are disposed laterally within the first perimeter 132 and the second perimeter 302 of the first ring-shaped DTI structure 108a. In some embodiments, the plurality of first dummy structures 308 are disposed laterally within the first perimeter 304 and the second perimeter 306 of the second ring-shaped DTI structure 108b. The plurality of first dummy structures 308 are disposed in a first array comprising a first plurality of rows and a first plurality of columns.

As shown in the cross-sectional view 300c of FIG. 3C, the second conductive line 116b overlies and is electrically coupled to the first conductive line 116a. In some embodiments, the perimeter of the first BTSV 130a is disposed laterally within a perimeter of the second conductive line 116b. For additional context, the plurality of BTSVs 130, the first ring-shaped DTI structure 108a, and the second ring-shaped DTI structure 108b are illustrated in phantom in FIG. 3C.

The second conductive line 116b is disposed at least partially laterally within the first perimeter 132 of the first ring-shaped DTI structure 108a. In some embodiments, the second conductive line 116b is disposed at least partially laterally between the first perimeter 132 of the first ring-shaped DTI structure 108a and the second perimeter 306 of the second ring-shaped DTI structure 108b. In further embodiments, the second conductive line 116b is disposed at least partially laterally between the second perimeter 302 of the first ring-shaped DTI structure 108a and the first perimeter 304 of the second ring-shaped DTI structure 108b.

In some embodiments, the perimeter of the second conductive line 116b is disposed laterally between the first perimeter 132 of the first ring-shaped DTI structure 108a and the second perimeter 306 of the second ring-shaped DTI structure 108b. In further embodiments, the perimeter of the second conductive line 116b is disposed laterally between the second perimeter 302 of the first ring-shaped DTI structure 108a and the first perimeter 304 of the second ring-shaped DTI structure 108b. In some embodiments, the perimeter of the second conductive line 116b has a square-like shape. In further embodiments, a size and shape of the second conductive line 116b is substantially the same as a size and shape of the first conductive line 116a (e.g., substantially the same size and shape includes small variations due to fabrication processes). In further embodiments, the second conductive line 116b may be referred to as a second conductive island (e.g., due to the island-like shape of the second conductive line). It will be appreciated that the second conductive line 116b is one of a collection of conductive lines of the second conductive layer 120b that are disposed in the second lower conductive interconnect structure 126. It will also be appreciated that each of the conductive lines of the collection of conductive lines of the second conductive layer 120b may have substantially similar features (e.g., structural features) as the second conductive line 116b.

Also shown in the cross-sectional view 300c of FIG. 3C, the second lower conductive interconnect structure 126 comprises a plurality of second dummy structures 310 disposed in the ILD structure 110. The second conductive layer 120b comprises the plurality of second dummy structures 310. The plurality of second dummy structures 310 are disposed along the second lateral plane. In some embodiments, the plurality of second dummy structures 310 may be or comprise, for example, copper (Cu), aluminum (Al), tungsten (W), gold (Au), silver (Ag), platinum (Pt), some other conductive material, or a combination of the foregoing. In further embodiments, the plurality of second dummy structures 310 have a same chemical composition as the second conductive line 116b. The plurality of second dummy structures 310 are configured to reduce dishing during formation of the ILD structure 110.

The plurality of second dummy structures 310 are disposed laterally within the first perimeter 132 and the second perimeter 302 of the first ring-shaped DTI structure 108a. In some embodiments, the plurality of second dummy structures 310 are disposed laterally within the first perimeter 304 and the second perimeter 306 of the second ring-shaped DTI structure 108b. The plurality of second dummy structures 310 are disposed in a second array comprising a second plurality of rows and a second plurality of columns. The second array overlies the first array. For example, the second plurality of rows overlie the first plurality of rows, respectively; the second plurality of columns overlies the first plurality of columns, respectively; and the plurality of second dummy structures 310 overlie the plurality of first dummy structures 308, respectively.

As shown in the cross-sectional view 300d of FIG. 3D, the first conductive plate 121a comprise an outer ring-shaped portion 312 and a plurality of conductive slats 314. The outer ring-shaped portion 312 extends laterally through the ILD structure 110 in a closed loop path. The outer ring-shaped portion 312 laterally surrounds the plurality of conductive slats 314. In some embodiments, the outer ring-shaped portion 312 has chamfered outer corners. The outer ring-shaped portion 312 has the width 214. The outer ring-shaped portion 312 also has a width 316. The width 316 may be substantially the same as the width 214. In other embodiments, the width 316 may be different than the width 214 (e.g., greater than or less than the width 214). The first conductive plate 121a has a length 317 (e.g., overall length). In some embodiments, the length 317 is between about 30 µm and about 100 µm.

The plurality of conductive slats 314 extend laterally through the ILD structure 110 is a first lateral direction. The plurality of conductive slats 314 extend laterally in the first lateral direction between opposite regions of the outer ring-shaped portion 312 of the first conductive plate 121a. The plurality of conductive slats 314 extend laterally in the first lateral direction between neighboring columns of the first plurality of columns. In some embodiments, the plurality of conductive slats 314 also extend laterally in the first lateral direction between neighboring columns of the second plurality of columns.

In some embodiments, outermost conductive slats of the plurality of conductive slats 314 are laterally spaced from the outer ring-shaped portion 312 by a third distance 318. The conductive slats of the plurality of conductive slats 314 that are disposed laterally between the outermost conductive slats of the plurality of conductive slats 314 are laterally spaced apart by a fourth distance 320. In some embodiments, the fourth distance 320 is different than (e.g., less than) the third distance 318. In other embodiments, the fourth distance 320 may be substantially the same as the third distance 318.

Also shown in the cross-sectional view 300d of FIG. 3D, the first conductive line 116a is disposed at least partially laterally within an outer perimeter of the first conductive plate 121a. As such, in some embodiments, the first BTSV 130a is disposed at least partially laterally within the outer perimeter of the first conductive plate 121a. In some embodiments, the perimeter of the first conductive line 116a is disposed laterally within the outer perimeter of the first conductive plate 121a. Therefore, in some embodiments, the perimeter of the first BTSV 130a may be disposed laterally within the outer perimeter of the first conductive plate 121a. In further embodiments, the perimeter of the first conductive line 116a may be disposed laterally within the outer ring-shaped portion 312, as shown in the cross-sectional view 300d of FIG. 3D. Thus, in further embodiments, the perimeter of the first BTSV 130a may be disposed laterally within the outer ring-shaped portion 312.

As shown in the cross-sectional view 300e of FIG. 3E, the second conductive plate 121b comprise an outer ring-shaped portion 322 and a plurality of conductive slats 324. The outer ring-shaped portion 322 extends laterally through the ILD structure 110 in a closed loop path. The outer ring-shaped portion 322 laterally surrounds the plurality of conductive slats 324. In some embodiments, the outer ring-shaped portion 322 has chamfered outer corners. The outer ring-shaped portion 322 of the second conductive plate 121b has a substantially similar footprint (e.g., layout) as the outer ring-shaped portion 312 of the first conductive plate 121a. Thus, an outer perimeter of the second conductive plate 121b is substantially the same size and shape as the outer perimeter of the first conductive plate 121a. In such embodiments, the outer ring-shaped portion 322 may have the width 214 and the width 316.

The plurality of conductive slats 324 extend laterally through the ILD structure 110 is a second lateral direction that is perpendicular to the first lateral direction. The plurality of conductive slats 324 extend laterally in the second lateral direction between opposite regions of the outer ring-shaped portion 322 of the second conductive plate 121b. The plurality of conductive slats 324 extend laterally in the second lateral direction between neighboring rows of the first plurality of rows. In some embodiments, the plurality of conductive slats 324 also extend laterally in the second lateral direction between neighboring rows of the second plurality of rows. In some embodiments, outermost conductive slats of the plurality of conductive slats 324 are laterally spaced from the outer ring-shaped portion 322 by the third distance 318. The conductive slats of the plurality of conductive slats 324 that are disposed laterally between the outermost conductive slats of the plurality of conductive slats 324 may be laterally spaced apart by the fourth distance 320.

Also shown in the cross-sectional view 300e of FIG. 3E, the second conductive line 116b is disposed at least partially laterally within the outer perimeter of the second conductive plate 121b. As such, in some embodiments, the first BTSV 130a and/or the first conductive line 116a are disposed at least partially laterally within the outer perimeter of the second conductive plate 121b. In some embodiments, the perimeter of the second conductive line 116b is disposed laterally within the outer perimeter of the second conductive plate 121b. Therefore, in some embodiments, the perimeter of the first BTSV 130a and/or the perimeter of the first conductive line 116a may be disposed laterally within the outer perimeter of the second conductive plate 121b. In further embodiments, the perimeter of the second conductive line 116b may be disposed laterally within the outer ring-shaped portion 322, as shown in the cross-sectional view 300e of FIG. 3E. Thus, in further embodiments, the perimeter of the first BTSV 130a and/or the perimeter of the first conductive line 116a may be disposed laterally within the outer ring-shaped portion 322.

In some embodiments, the second conductive plate 121b is disposed nearer the first conductive plate 121a than any other conductive plates of the plurality of conductive plates 121. In other words, the second conductive plate 121b is vertically spaced closer to the first conductive plate 121a than any other conductive plates of the plurality of conductive plates 121. It will be appreciated that each of the conductive plates of the plurality of conductive plates 121 may have substantially similar features (e.g., structural features) as the first conductive plate 121a and/or the second conductive plate 121b. While FIGS. 3D and 3E only illustrate the layout (e.g., footprint) of the first conductive plate 121a and the layout of the second conductive plate 121b, it will be appreciated that the other conductive plates of the plurality of conductive plates 121 may have a substantially similar layout as the first conductive plate 121a and/or a substantially similar layout as the second conductive plate 121b. In some embodiments, the layouts of the conductive plates of the plurality of conductive plates 121 alternate back and forth between the layout of the first conductive plate 121a and the layout of the second conductive plate 121b. For example, the first conductive plate 121a, the third conductive plate 121c, a fifth conductive plate, and so forth may each have the same layout (e.g., the layout illustrated in FIG. 3D); and the second conductive plate 121b, the fourth conductive plate 121d, a sixth conductive plate, and so forth may each have the same layout (e.g., the layout illustrated in FIG. 3E). It will also be appreciated that, in some embodiments, the first conductive plate 121a may have the layout illustrated in FIG. 3E, and the second conductive plate 121b may have the layout illustrate in FIG. 3D.

As shown in the cross-sectional view 300f of FIG. 3F, the plurality of BTSVs 130 are disposed within the plurality of STI structures 106. For example, some of the plurality of BTSVs 130 (e.g., that underlie the first conductive plate 121a) are disposed in the first STI structure 106a. Perimeters of the plurality of BTSVs 130 are disposed within the plurality of STI structure 106. For example, the first BTSV 130a is disposed within the first STI structure 106a. In some embodiments, the perimeters of the plurality of BTSVs 130 are disposed laterally between first and second perimeters of the plurality of BTSVs 130. For example, the perimeter of the first BTSV 130a is disposed laterally between a first perimeter 326 (e.g., outer perimeter) of the first STI structure 106a and a second perimeter 328 (e.g., inner perimeter) of the first STI structure 106a.

Also shown in the cross-sectional view 300f of FIG. 3F, the first ring-shaped DTI structure 108a is disposed in the first STI structure 106a. In some embodiments, the first ring-shaped DTI structure 108a is disposed laterally between the first perimeter 326 and the second perimeter 328 of the first STI structure 106a. In some embodiments, the second ring-shaped DTI structure 108b is also disposed in the first STI structure 106a. In some embodiments, the second ring-shaped DTI structure 108b is disposed laterally between the first perimeter 326 and the second perimeter 328 of the first STI structure 106a. Because the first ring-shaped DTI structure 108a and the second ring-shaped DTI structure 108b may be disposed laterally between the first perimeter 326 and the second perimeter 328 of the first STI structure 106a, it will be appreciated that other structures of the IC (e.g., the first conductive line 116a, the second conductive line 116b, etc.) that are disposed laterally between the first ring-shaped DTI structure 108a and the second ring-shaped DTI structure 108b may also be disposed laterally between the first perimeter 326 and the second perimeter 328 of the first STI structure 106a.

Figure 4A:
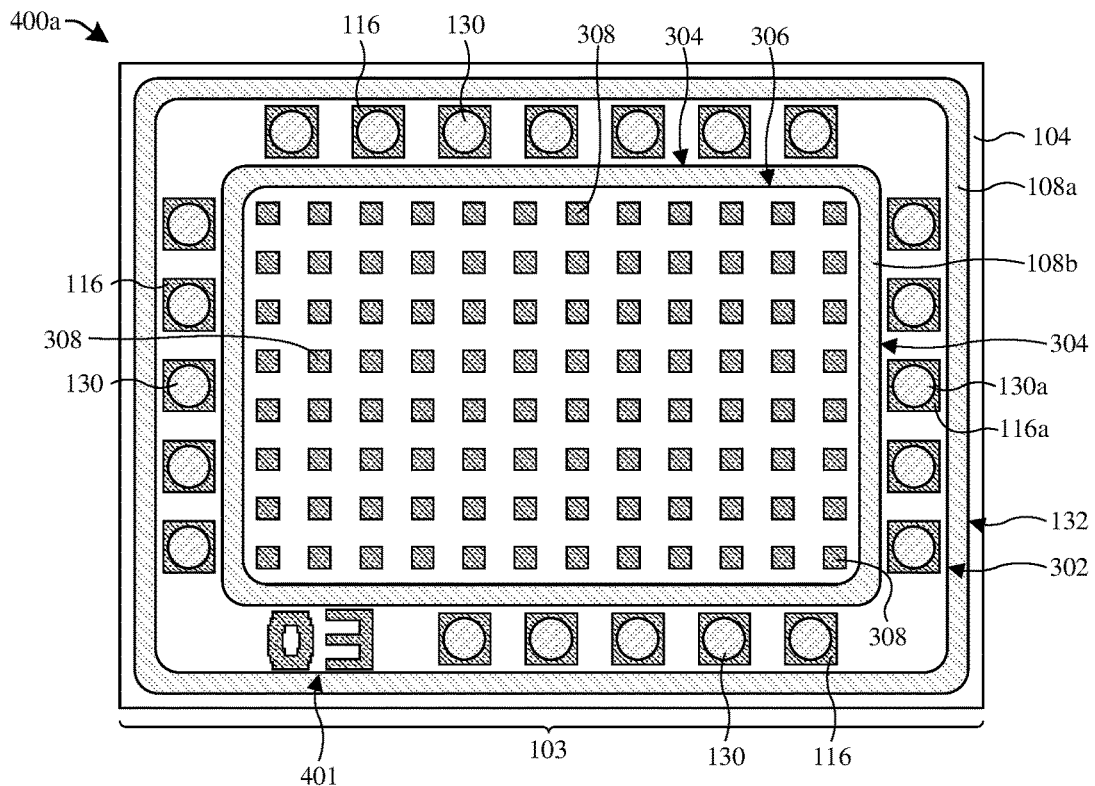
FIGS. 4A-4C illustrate various layout views of some embodiments of the IC of FIG. 2.
Figure 4B:
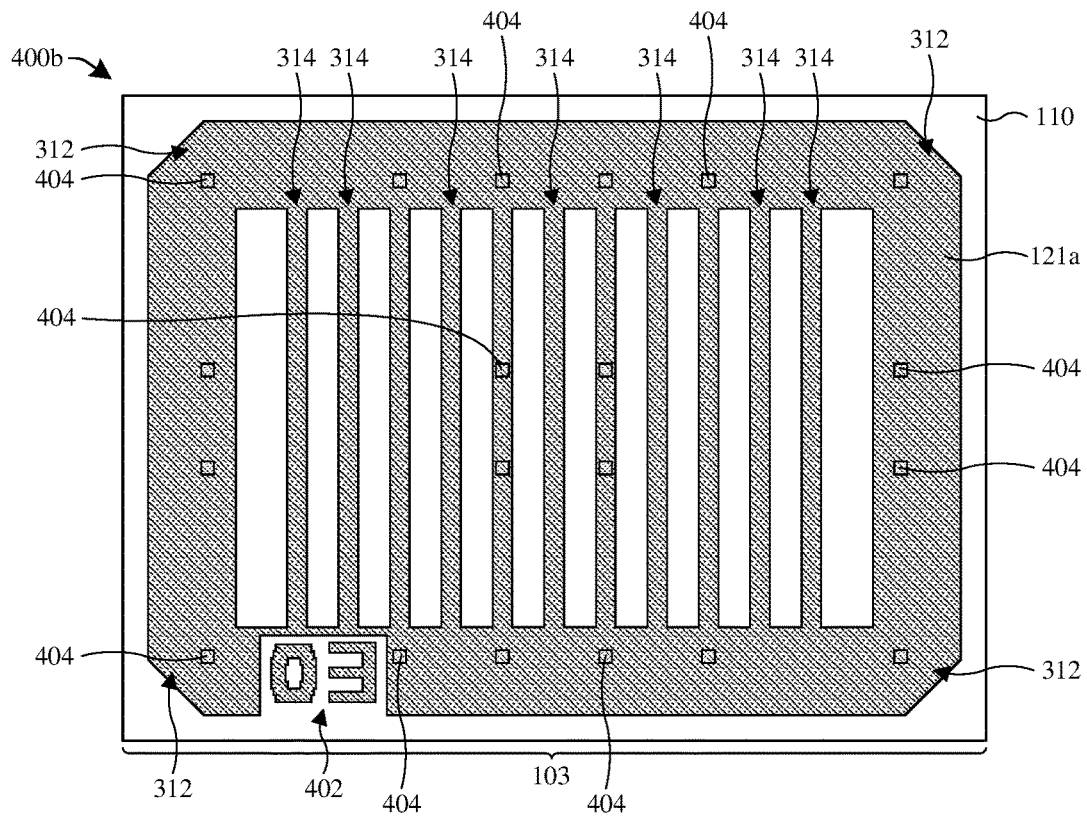
Figure 4C:
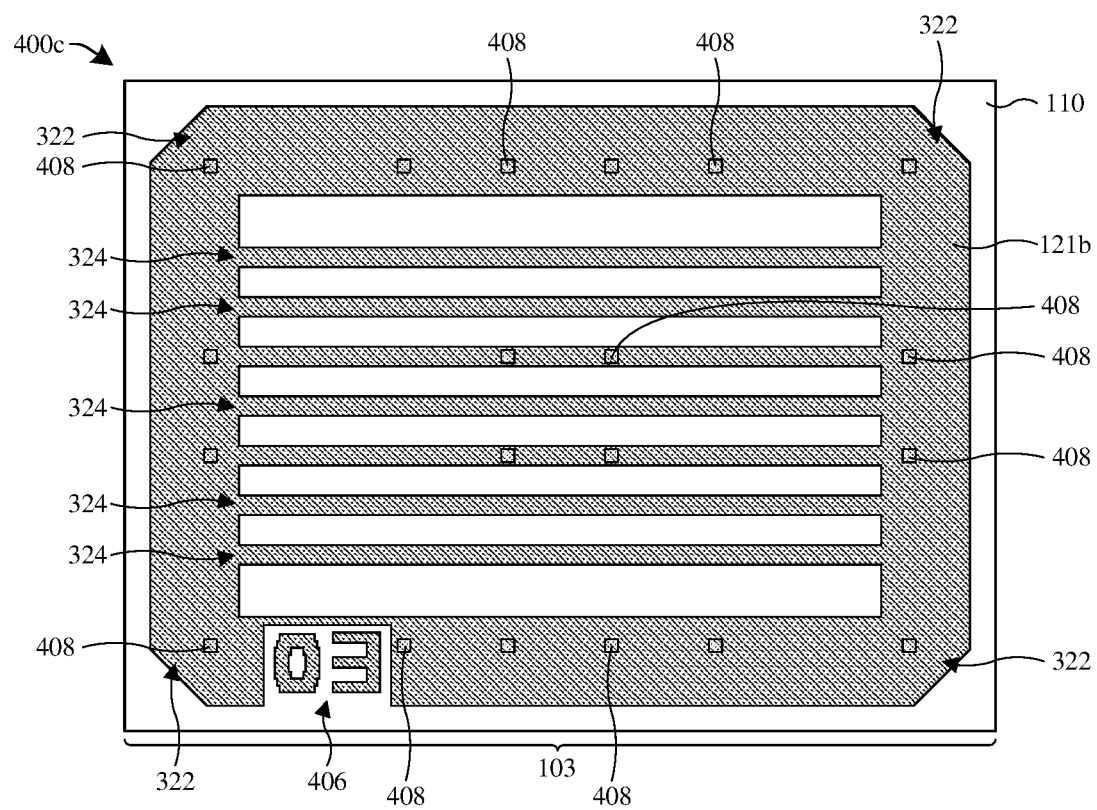

FIGS. 4A-4C illustrate various layout views 400a-400c of some embodiments of the IC of FIG. 2. More specifically, FIG. 4A illustrates a layout view 400a of an embodiment of the IC of FIG. 2. FIG. 4B illustrates a layout view 400b of the embodiment of the IC of FIG. 2. FIG. 4C illustrates a layout view 400c of the embodiment of the IC of FIG. 2. It will be appreciated that the various layout views 400a-400c of FIGS. 4A-4C illustrate features that are out of plane (e.g., vertically spaced from one another) from one another. For example, FIG. 4A illustrates the substrate 104, the plurality of DTI structures 108, the plurality of BTSVs 130, and the conductive lines of the first conductive layer 120a (of the testing region 103) to more clearly illustrate the relationship between such features.

As shown in the layout view 400a of FIG. 4A, the first conductive layer 120a (see, FIG. 2) comprises a testing structure indicator 401 (e.g., a testing pad indicator). The testing structure indicator 401 indicates which testing structure (e.g., which plurality of conductive plates 121) is disposed in a given area. For example, the testing structure indicator 401 illustrated in the layout view 400a of FIG. 4A is in the shape of the number "03." Thus, the testing indicator 401 indicates that the plurality of conductive plates 121 is the "03" testing structure of the IC. In some embodiments, the testing structure indicator 401 is disposed laterally between the first perimeter 132 of the first ring-shaped DTI structure 108a and the second perimeter 306 of the second ring-shaped DTI structure 108b. In further embodiments, the testing structure indicator 401 is disposed laterally between the second perimeter 302 of the first ring-shaped DTI structure 108a and the first perimeter 304 of the second ring-shaped DTI structure 108b.

As shown in the layout view 400b of FIG. 4B, the first conductive plate 121a comprises a testing structure indicator 402. The testing structure indicator 402 overlies the testing structure indicator 401. The testing indicator 402 has a substantially similar layout as the testing structure indicator 401. The testing structure indicator 402 indicates the testing structure that is disposed in the given area.

The layout view 400b of FIG. 4B also illustrates a first group of conductive vias 404 of the plurality of conductive vias 118. The first group of conductive vias 404 are disposed over and electrically coupled to the first conductive plate 121a. Thus, it will be appreciated that, like the layout view 400a of FIG. 4A, the layout view 400b of FIG. 4B illustrates structures that are out of plane (e.g., vertically spaced from one another) from one another to better illustrate the relationship between such structures. Some of the conductive vias of the first group of conductive vias 404 may overlie the outer ring-shaped portion 312 of the first conductive plate 121a. Some other of the conductive vias of the first group of conductive vias 404 may overlie the plurality of conductive slats 314 of the first conductive plate 121a. The first group of conductive vias 404 extend vertically from the first conductive plate 121a to the second conductive plate 121b, thereby electrically coupling the first conductive plate 121a to the second conductive plate 121b.

As shown in the layout view 400c of FIG. 4C, the second conductive plate 121b comprises a testing structure indicator 406. The testing structure indicator 406 overlies the testing structure indicator 401 and the testing structure indicator 402. The testing indicator 406 has a substantially similar layout as the testing structure indicator 401 and the testing structure indicator 402. The testing structure indicator 406 indicates the testing structure that is disposed in the given area. It will be appreciated that each of the plurality of conductive plates 121 may comprise a testing indicator that has a substantially similar layout as the testing structure indicator 401 and/or the testing structure indicator 402.

The layout view 400c of FIG. 4C also illustrates a second group of conductive vias 408 of the plurality of conductive vias 118. The second group of conductive vias 408 are disposed over and electrically coupled to the second conductive plate 121b. Thus, it will be appreciated that, like the layout view 400a of FIG. 4A and the layout view 400b of FIG. 4B, the layout view 400c of FIG. 4C illustrates structures that are out of plane (e.g., vertically spaced from one another) from one another to better illustrate the relationship between such structures. Some of the conductive vias of the second group of conductive vias 408 may overlie the outer ring-shaped portion 322 of the second conductive plate 121b. Some other of the conductive vias of the second group of conductive vias 408 may overlie the plurality of conductive slats 324 of the second conductive plate 121b. In some embodiments, the conductive vias of the second group of conductive vias 408 overlie the conductive vias of the first group of conductive vias 404, respectively. The second group of conductive vias 408 extend vertically from the second conductive plate 121b to the third conductive plate 121c, thereby electrically coupling the second conductive plate 121b to the third conductive plate 121c. It will be appreciated that groups of conductive vias with substantially similar layouts as the first group of conductive vias 404 extend vertically between neighboring plates of the plurality of conductive plates 121 to electrically couple the plurality of conductive plates 121 together.

Figure 5A:
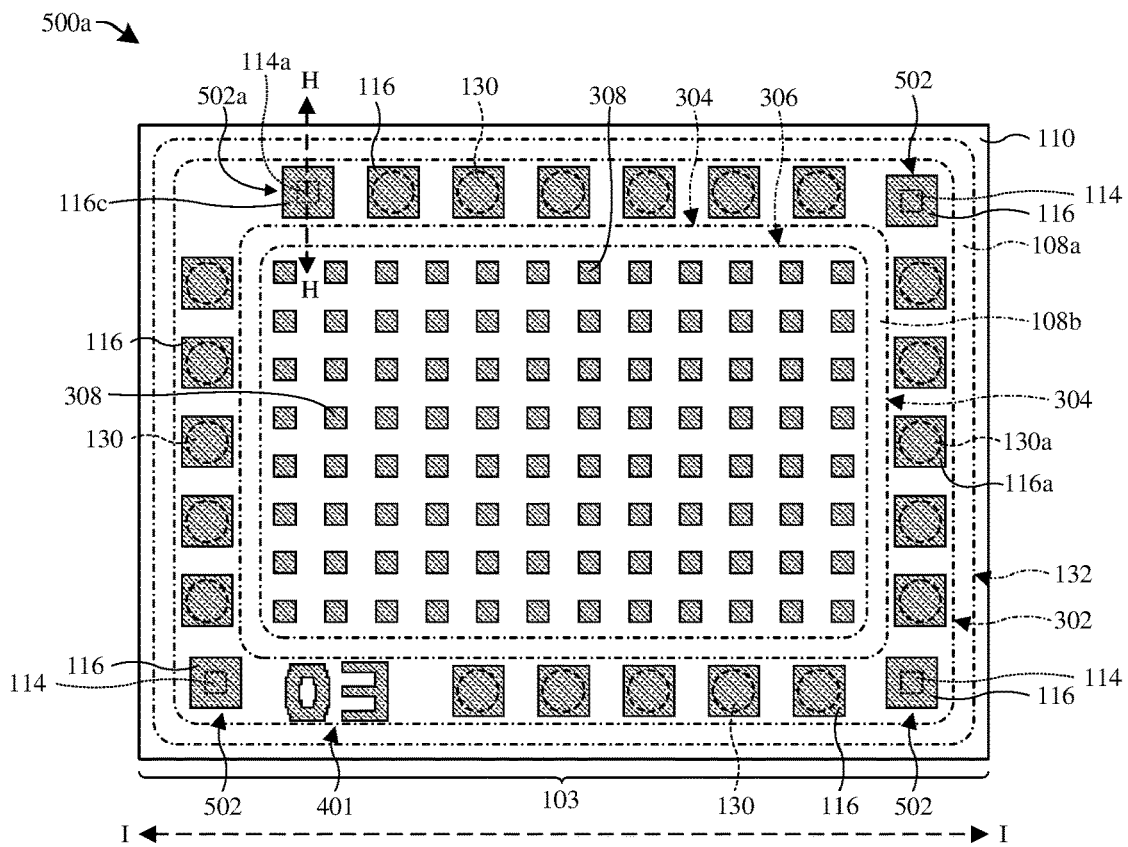
FIGS. 5A-5C illustrate various cross-sectional views of some embodiments of the IC of FIG. 2.
Figure 5B:
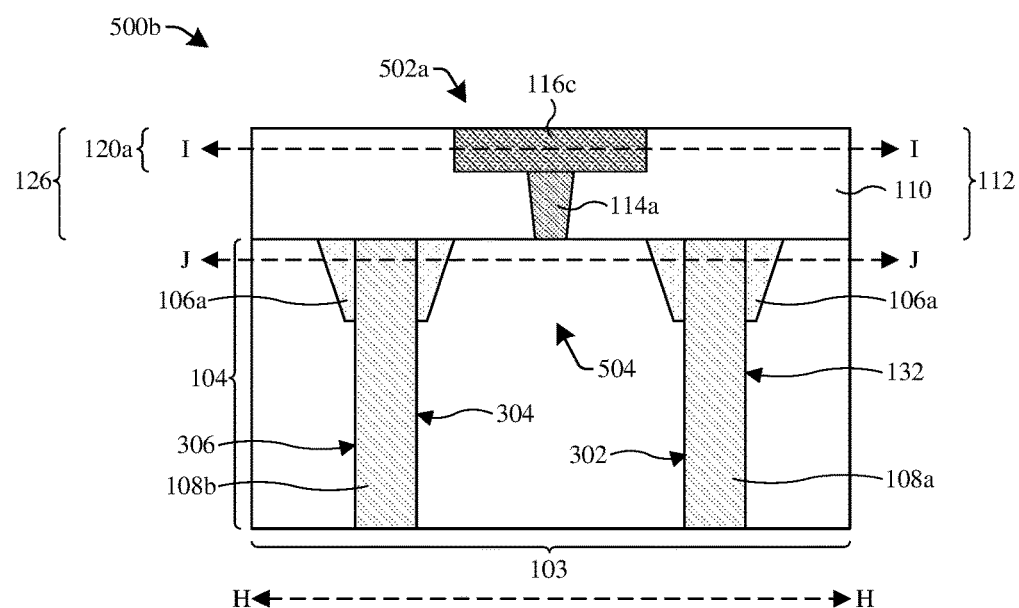
Figure 5C:
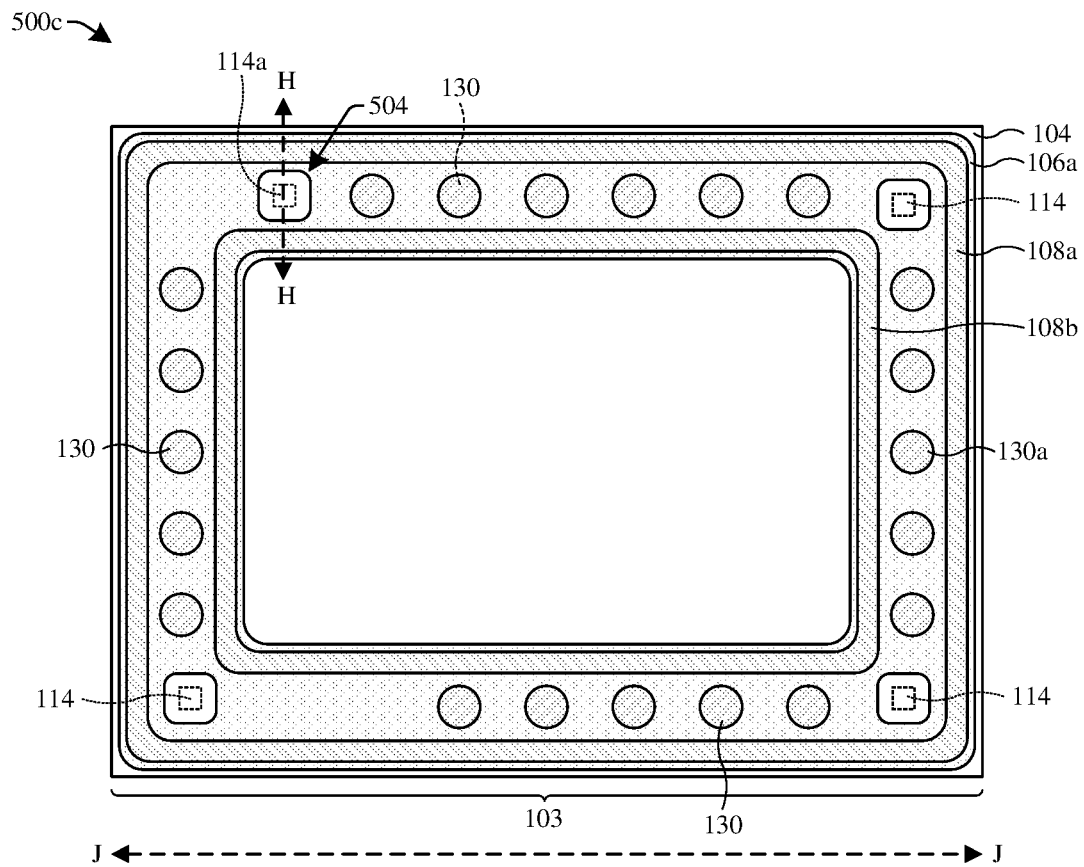

FIGS. 5A-5C illustrate various cross-sectional views 500a-500c of some embodiments of the IC of FIG. 2. More specifically, FIG. 5A illustrates a cross-sectional view 500a of an embodiment of the IC of FIG. 2. FIG. 5B illustrates a cross-sectional view 500b of the IC of FIG. 5A taken along line H-H of FIG. 5A. The cross-sectional view 500a of FIG. 5A is taken along line I-I of FIG. 5B. FIG. 5C illustrates a cross-sectional view 500c of the IC of FIG. 5B taken along line J-J of FIG. 5B.

As shown in the various cross-sectional views 500a-500c of FIGS. 5A-5C, the second lower conductive interconnect structure 126 comprises a plurality of substrate connect structures 502. The plurality of substrate connect structures 502 comprises a first substrate connect structure 502a. The first substrate connect structure 502a comprises a third conductive line 116c of the plurality of conductive lines 116. The second lower conductive interconnect structure 126 comprises the third conductive line 116c. The first conductive layer 120a comprise the third conductive line 116c. The third conductive line 116c is disposed along the first lateral plane.

The first substrate connect structure 502a also comprises a first conductive contact 114a of the plurality of conductive contacts 114. The second lower conductive interconnect structure 126 comprises the first conductive contact 114a. The first conductive contact 114a extends vertically from the third conductive line 116c to the substrate 104. The first conductive contact 114a extends vertically from the third conductive line 116c to a portion of the substrate 104 disposed within the second perimeter 302 of the first ring-shaped DTI structure 108a. In further embodiments, the first conductive contact 114a extends vertically from the third conductive line 116c to the portion of the substrate 104 disposed laterally between the first ring-shaped DTI structure 108a and the second ring-shaped DTI structure 108b. The first conductive contact 114a electrically couples the third conductive line 116c to the portion of the substrate 104 disposed within the second perimeter 302 of the first ring-shaped DTI structure 108a. In some embodiments, the first conductive contact 114a electrically couples the third conductive line 116c to the portion of the substrate 104 disposed laterally between the first ring-shaped DTI structure 108a and the second ring-shaped DTI structure 108b.

In some embodiments, the third conductive line 116c is electrically coupled to a voltage (e.g., 0 V). In other embodiments, the third conductive line 116c may be floating. In such embodiments, the plurality of substrate connect structures 502 may improve performance of the IC by limiting unexpected voltages drops between the substrate 104 and the plurality of BTSVs 130.

The third conductive line 116c and the first conductive contact 114a are disposed at least partially laterally within the first perimeter 132 of the first ring-shaped DTI structure 108a. In some embodiments, the third conductive line 116c and the first conductive contact 114a are disposed at least partially laterally between the first perimeter 132 of the first ring-shaped DTI structure 108a and the second perimeter 306 of the second ring-shaped DTI structure 108b. In further embodiments, the third conductive line 116c and the first conductive contact 114a are disposed at least partially laterally between the second perimeter 302 of the first ring-shaped DTI structure 108a and the first perimeter 304 of the second ring-shaped DTI structure 108b.

In some embodiments, a perimeter of the third conductive line 116c and/or a perimeter of the first conductive contact 114a are disposed laterally between the first perimeter 132 of the first ring-shaped DTI structure 108a and the second perimeter 306 of the second ring-shaped DTI structure 108b. In further embodiments, the perimeter of the third conductive line 116c and/or the perimeter of the first conductive contact 114a are disposed laterally between the second perimeter 302 of the first ring-shaped DTI structure 108a and the first perimeter 304 of the second ring-shaped DTI structure 108b. The first conductive contact 114a is disposed laterally within an opening 504 in the first STI structure 106a. The opening 504 of the first STI structure 106a is laterally surrounded by corresponding portions of the first STI structure 106a. It will be appreciated that each of the plurality of substrate connect structures 502 may have substantially similar features (e.g., structural features) as the first substrate connect structure 502a. It will further be appreciated that, in some embodiments, the conductive contacts of each of the substrate connect structures 502 may be disposed laterally within corresponding openings of the first STI structure 106a, as shown in the cross-sectional view 500c of FIG. 5C.

Figure 6:
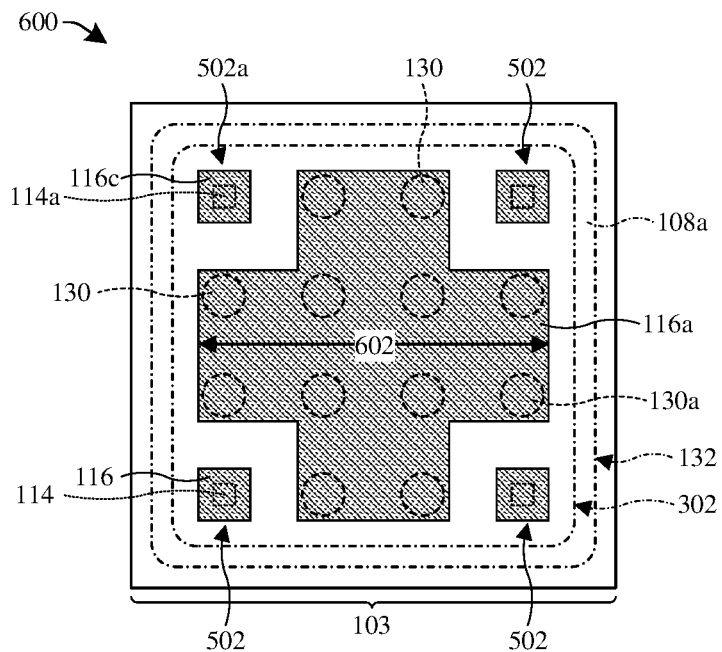
FIG. 6 illustrate a cross-sectional view of some other embodiments of the IC of FIGS. 5A-5C.

FIG. 6 illustrate a cross-sectional view 600 of some other embodiments of the IC of FIGS. 5A-5C.

As shown in the cross-sectional view 600 of FIG. 6, the plurality of BTSVs 130 disposed in the testing region 103 may be electrically coupled to the first conductive line 116a. In such embodiments, the plurality of BTSVs 130 are disposed within a perimeter of the first conductive line 116a. In some embodiments in which the plurality of BTSVs 130 are electrically coupled to the first conductive line 116a, the first conductive line 116a has a length 602 (e.g., overall length). The length 602 may be between about 30 µm and about 50 µm. In some embodiments, the first conductive line 116a may have a cross-shaped layout. However, other geometric shapes are amenable. While not shown in the cross-sectional view 600 of FIG. 6, it will be appreciated that the first conductive plate 121a may still comprise the testing structure indicator 402.

Figure 7:
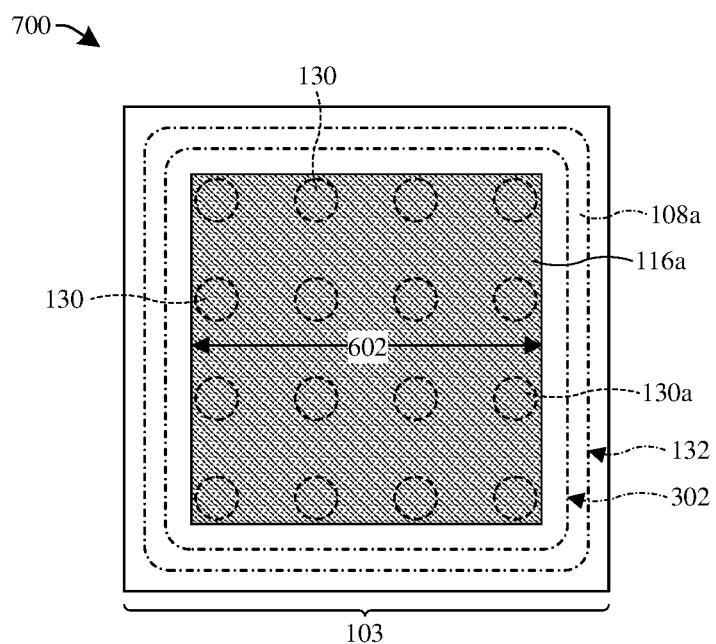
FIG. 7 illustrate a cross-sectional view of some other embodiments of the IC of FIG. 6.

FIG. 7 illustrate a cross-sectional view 700 of some other embodiments of the IC of FIG. 6.

As shown in the cross-sectional view 700 of FIG. 7, in some embodiments, the IC may not include the plurality of substrate connect structures 502. In such embodiments, for a given area, more BTSVs of the plurality of BTSVs 130 may be electrically coupled to the first conductive line 116a than in an IC comprising the plurality of substrate connect structures 502 (see, e.g., FIG. 6).

Figure 8:
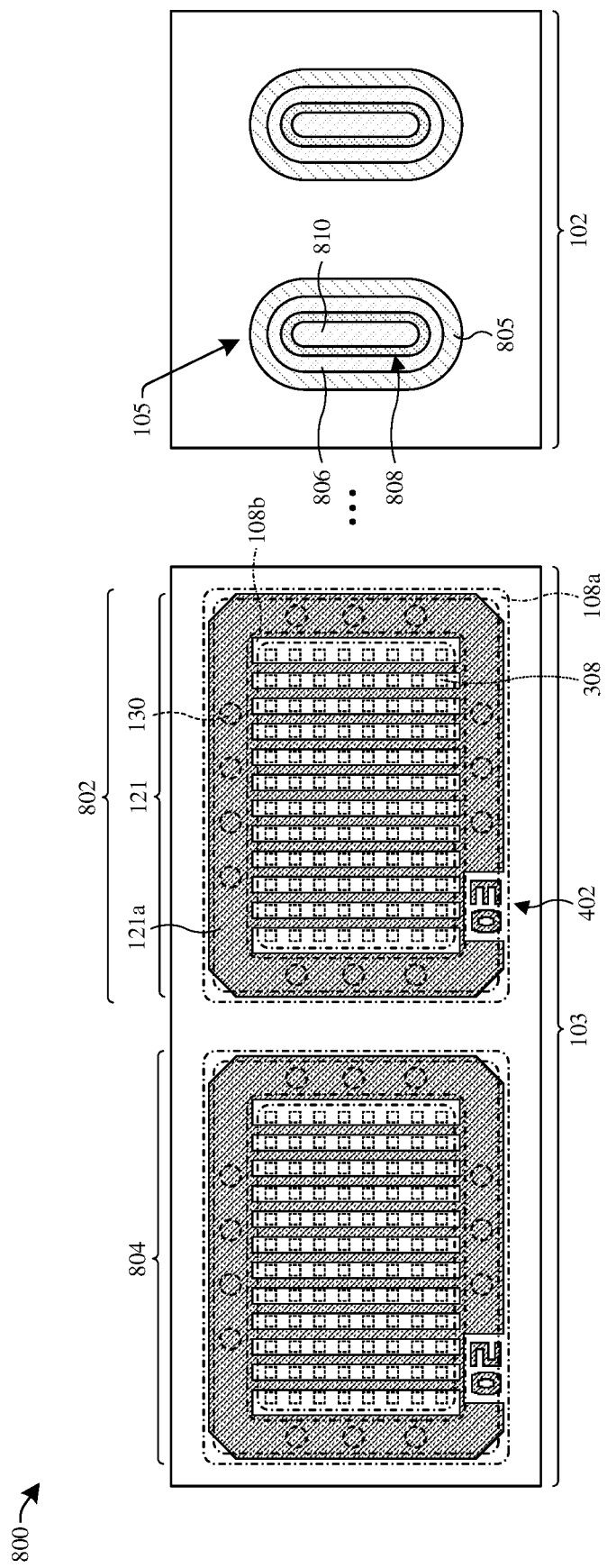
FIG. 8 illustrates a layout view of some embodiments of the IC of FIG. 1.

FIG. 8 illustrates a layout view 800 of some embodiments of the IC of FIG. 1.

As shown in the layout view 800 of FIG. 8, the IC comprises a first testing structure 802 and a second testing structure 804 disposed in the testing region 103. The second testing structure 804 is disposed on a side of the first testing structure 802. The first testing structure 802 is laterally spaced from the second testing structure 804. The first testing structure 802 and the second testing structure 804 are electrically coupled to various semiconductor devices of the IC in a predefined manner, and the first testing structure 802 and the second testing structure 804 are configured so that circuit probes can be connected to the IC (e.g., for rigidity in the IC and for routing purposes) via a plurality of probe pads, thereby allowing an electronic test process (e.g., automated wafer probe test) to be performed on the IC.

The first testing structure 802 comprises the plurality of conductive plates 121. The second testing structure 804 comprises substantially similar features (e.g., structural features) and has a substantially similar layout as the first testing structure 802. The testing indicators of the first testing structure 802 and the testing indicators of the second testing structure 804 are different (e.g., "02" and "03"), so that the specific testing structures may be easily identified (e.g., via an electron microscope) during the electronic test process. While the layout view 800 of FIG. 8 illustrate two testing structures, it will be appreciated the IC may comprise any number of testing structures disposed in the testing region 103.

Also shown in the layout view 800 of FIG. 8, the semiconductor device 105 is one of a plurality of semiconductor devices disposed in the device region 102. In some embodiments, the semiconductor device 105 comprises a body contact region 805 (e.g., ring-shaped body contact region), a drain region 806 (e.g., ring-shaped drain region), a gate stack 808 (e.g., ring-shaped gate stack), and a source region 810. In further embodiments, an outer perimeter of the semiconductor device 105 is defined by an outer perimeter of the body contact region 805. In other embodiments, the body contact region 805 and the drain region 806 may be inverted (e.g., swap places), and the outer perimeter of the semiconductor device 105 is defined by an outer perimeter of the drain region 806.

In some embodiments, the other semiconductor devices of the plurality of semiconductor devices comprises substantially similar features (e.g., structural features) as the semiconductor device 105. While the layout view 800 of FIG. 8 illustrates the plurality of semiconductor devices comprising two semiconductor devices, it will be appreciated the plurality of semiconductor devices may comprise any number of semiconductor devices in the device region 102.

The testing region 103 is laterally spaced from the semiconductor device 105. The testing region 103 is disposed outside the perimeter of the semiconductor device 105. The first testing structure 802 is laterally spaced from the semiconductor device 105. The first testing structure 802 is disposed outside the perimeter of the semiconductor device 105. In some embodiments, the semiconductor device 105 is disposed nearer the first testing structure 802 than any other of the plurality of semiconductor devices of the device region 102. In further embodiments, the semiconductor device 105 is disposed nearer the first testing structure 802 than any other semiconductor devices of the IC.

Figure 9:
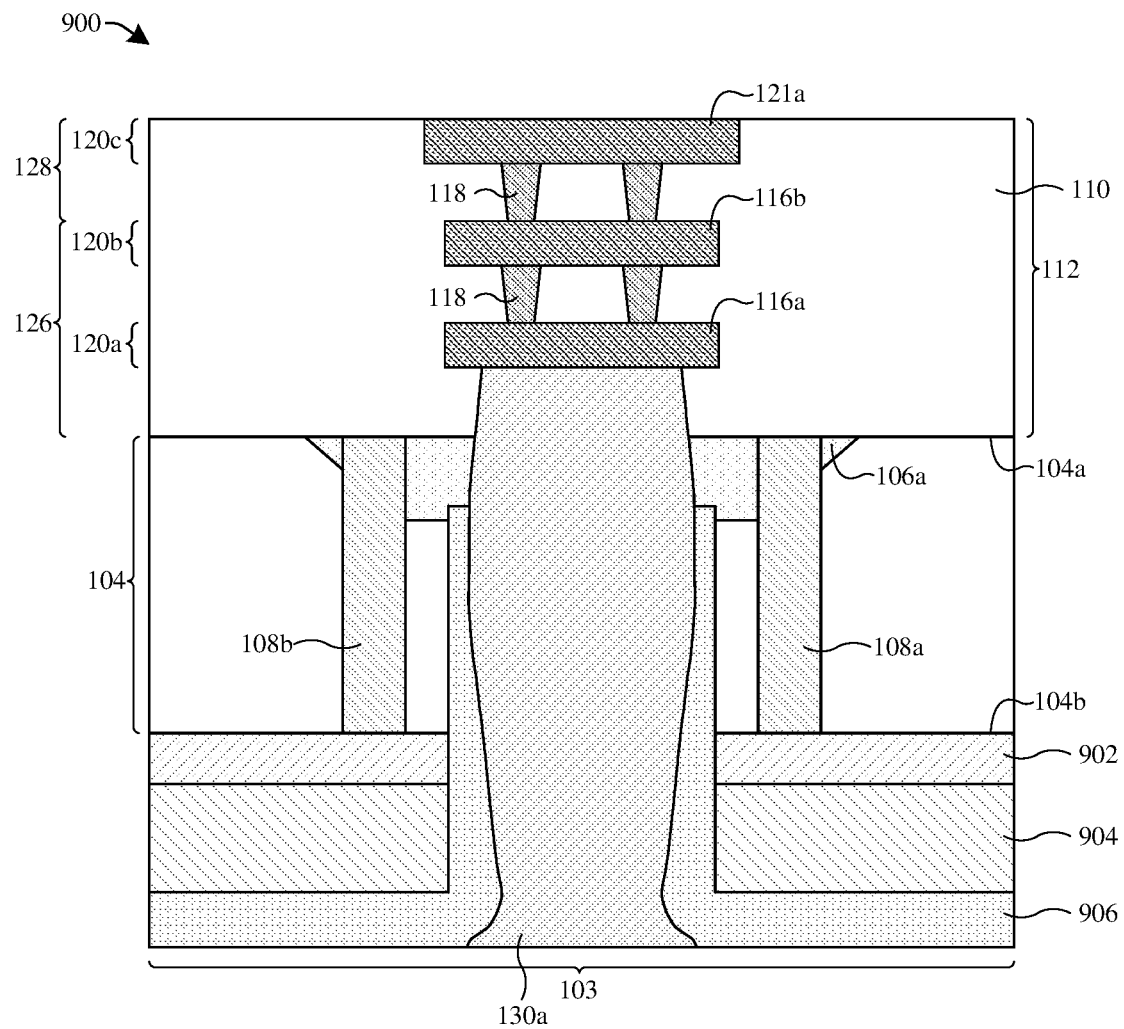
FIG. 9 illustrates a cross-sectional view of some other embodiments of the IC of FIG. 2.

FIG. 9 illustrates a cross-sectional view 900 of some other embodiments of the IC of FIG. 2.

As shown in the cross-sectional view 900 of FIG. 9, a first dielectric structure 902 is disposed on a second side (e.g., back-side) of the substrate 104. The first dielectric structure 902 may be or comprise, for example, a high-k dielectric material (e.g., a dielectric material with a dielectric constant greater than about 3.9, such as hafnium oxide (HfO), tantalum oxide (TaO), hafnium silicon oxide (HfSiO), or the like), some other dielectric material, or a combination of the foregoing. The first dielectric structure 902 may have a thickness between about 500 angstroms (Å) and about 700 Å.

In some embodiments, a second dielectric structure 904 is disposed on a side of the first dielectric structure 902 opposite the substrate 104. The second dielectric structure 904 may be or comprise, for example, undoped silicate glass (USG), an oxide (e.g., $SiO_2$), a nitride (e.g., SiN), an oxy-nitride (e.g., SiON), some other dielectric material, or a combination of the foregoing. The second dielectric structure 904 may have a thickness between about 3000 Å and about 5000 Å.

A dielectric liner structure 906 lines, at least partially, the sidewalls of the first BTSV 130a. In some embodiments, the dielectric liner structure 906 also lines a surface of the second dielectric structure 904. The dielectric liner structure 906 extends vertically through the second dielectric structure 904, the first dielectric structure 902, and the substrate 104 to the first STI structure 106a. In some embodiments, the dielectric liner structure 906 penetrates the first STI structure 106a, so that the dielectric liner structure 906 extends partially vertically through the first STI structure 106a.

The dielectric liner structure 906 may be or comprise, for example, an oxide (e.g., $SiO_2$), a nitride (e.g., SiN), an oxy-nitride (e.g., SiON), some other dielectric material, or a combination of the foregoing. The dielectric liner structure 906 may have a thickness between about 1500 Å and about 5500 Å. In some embodiments, the dielectric liner structure 906 is a multi-layer structure (e.g., bi-layer structure). In such embodiments, the dielectric liner structure 906 may comprise an oxide layer (e.g., $SiO_2$) lining the second dielectric structure 904, the first dielectric structure 902, the substrate 104, and the first STI structure 106a; and a nitride layer (e.g., SiN) that lines the oxide layer. In further such embodiments, the oxide layer may have a thickness between about 500 Å and about 1500 Å; and the nitride layer may have a thickness between about 1000 Å and about 3000 Å.

Also shown in the cross-sectional view 900 of FIG. 9, the sidewalls of the first BTSV 130a may be arced. For example, the sidewalls of the first BTSV 130a may first arc outward, then arc inward, and then arc outward again. In such embodiments, a profile of the first BTSV 130a has an hourglass-like shape (e.g., an hourglass shape having a larger upper portion than lower portion), as shown in the cross-sectional view 900 of FIG. 9. In some embodiments, a surface (e.g., lower surface) of the first BTSV 130a is substantially co-planar with a surface (e.g., lower surface) of the dielectric liner structure 906.

Figure 10:
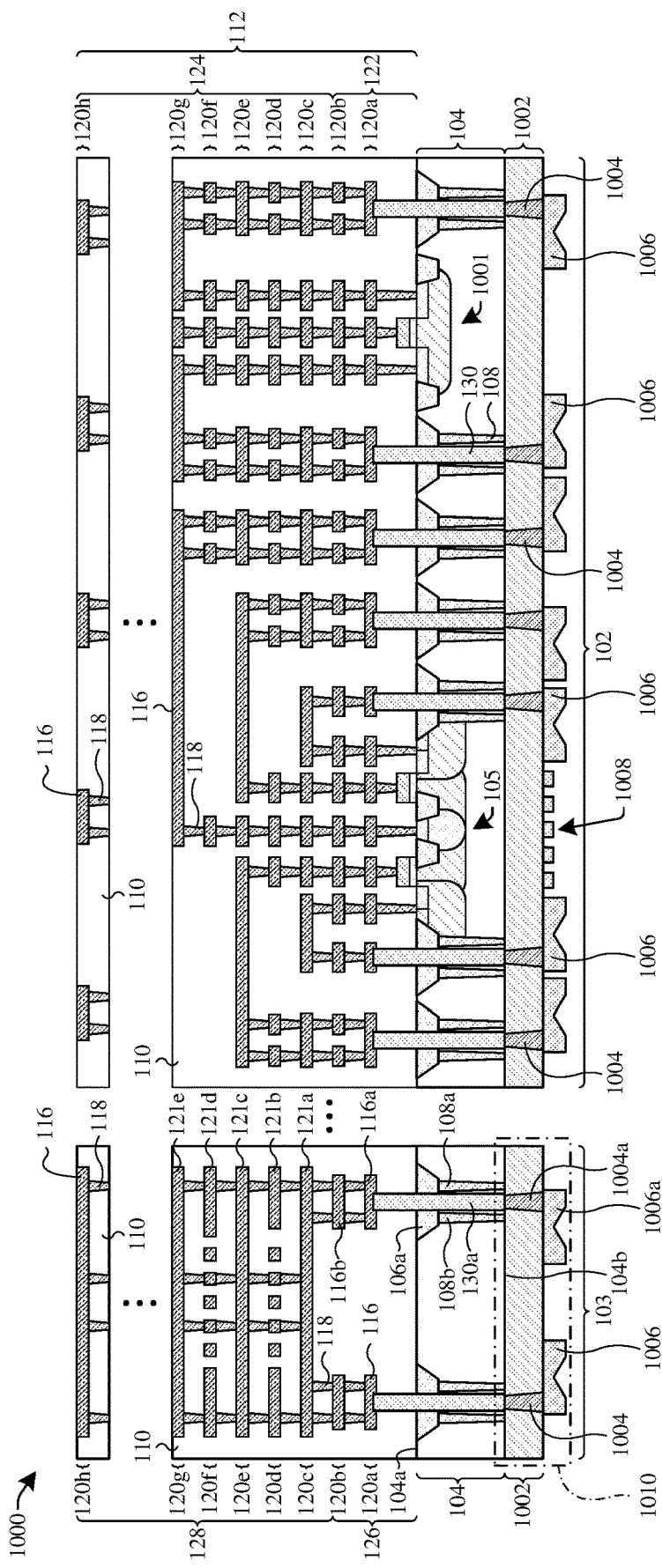
FIG. 10 illustrates a cross-sectional view of some other embodiments of the IC of FIG. 1.

FIG. 10 illustrates a cross-sectional view 1000 of some other embodiments of the IC of FIG. 1.

As shown in the cross-sectional view 1000 of FIG. 10, the IC comprises the semiconductor device 105 and a semiconductor device 1001. The semiconductor device 105 and the semiconductor device 1001 are disposed in the device region 102 of the IC. In some embodiments, the semiconductor device 105 is a high-voltage device (e.g., 100 V BCD device). In further embodiments, the semiconductor device 1001 is a low-voltage device (e.g., a logic MOSFET). It will be appreciated that the IC may comprise other types of semiconductor devices (e.g., mid-voltage devices).

Also shown in the cross-sectional view 1000 of FIG. 10, a passivation structure 1002 is disposed on the second side of the substrate 104. The passivation structure 1002 may be or comprise, for example, undoped silicate glass (USG), an oxide (e.g., $SiO_2$), a nitride (e.g., SiN), an oxy-nitride (e.g., SiON), some other dielectric material, or a combination of the foregoing. While not shown in the cross-sectional view 1000 of FIG. 10, it will be appreciated that the first dielectric structure 902, the second dielectric structure 904, and the dielectric liner structure 906 (see, FIG. 9) may each be vertically disposed between the passivation structure 1002 and the second surface 104b of the substrate 104.

The passivation structure 1002 may have a thickness between about 8000 Å and about 12000 Å. In some embodiments, the passivation structure 1002 is a multi-layer structure (e.g., bi-layer structure). In such embodiments, the passivation structure 1002 may comprise a first dielectric layer (e.g., SiN) and a second dielectric layer (e.g., USG). In such embodiments, the first dielectric layer may vertically separate the second dielectric layer from the substrate 104. In further such embodiments, the first dielectric layer may have a thickness between about 1000 Å and about 2000 Å; and the second dielectric layer may have a thickness between about 7000 Å and about 10000 Å.

A plurality of conductive vias 1004 are disposed in the passivation structure 1002. The plurality of conductive vias 1004 extend vertically through the passivation structure 1002. The plurality of conductive vias 1004 extend vertically through the passivation structure 1002 to contact the plurality of BTSVs 130. The plurality of conductive vias 1004 are electrically coupled to the plurality of BTSVs 130, respectively. For example, a first conductive via 1004a of the plurality of conductive vias 1004 is electrically coupled to the first BTSV 130a. In some embodiments, the first BTSV 130a penetrates the first conductive line 116a, as shown in the cross-sectional view 1000 of FIG. 10.

In some embodiments, the plurality of conductive vias 1004 have angled sidewalls. In other embodiments, the plurality of conductive vias 1004 have substantially straight (e.g., substantially vertical) sidewalls. The plurality of conductive vias 1004 may be or comprise, for example, an aluminum-based alloy (e.g., aluminum-copper (AlCu)), copper (Cu), aluminum (Al), tungsten (W), gold (Au), silver (Ag), platinum (Pt), some other metal, or a combination of the foregoing.

A plurality of input/output (I/O) structures 1006 (e.g., bond pads, microbumps, C4 bumps, contact pads, etc.) are disposed on a side of the passivation structure 1002 opposite the substrate 104. In some embodiments, the plurality of I/O structures 1006 may have a substantially planar surface (e.g., a substantially planar lower surface) and angled surfaces that extend from the substantially planar surface toward the substrate 104, as shown in the cross-sectional view 1000 of FIG. 10.

The plurality of I/O structures 1006 are electrically coupled to the plurality of conductive vias 1004, respectively. For example, a first I/O structure 1006a is electrically coupled to the first conductive via 1004a. As such, the plurality of BTSVs 130 and the plurality of conductive vias 1004 electrically couple the plurality of I/O structures 1006 to the conductive interconnect structure 112. For example, the first conductive via 1004a and the first BTSV 130a electrically couple the first I/O structure 1006a to the first conductive line 116a. The plurality of I/O structures 1006 may be or comprise, for example, an aluminum-based alloy (e.g., aluminum-copper (AlCu)), copper (Cu), aluminum (Al), tungsten (W), gold (Au), silver (Ag), platinum (Pt), some other metal, or a combination of the foregoing.

In some embodiments, a grid structure 1008 (e.g., metal grid structure) is disposed on the side of the passivation structure 1002 opposite the substrate 104. The grid structure 1008 is disposed below the semiconductor device 105. The grid structure 1008 may be for grounding purposes and/or for reduced surface field (RESURF) purposes. The grid structure 1008 may be or comprise, for example, an aluminum-based alloy (e.g., aluminum-copper (AlCu)), copper (Cu), aluminum (Al), tungsten (W), gold (Au), silver (Ag), platinum (Pt), some other metal, or a combination of the foregoing. In some embodiments, the grid structure 1008 is a finger-shaped grid structure.

Figure 11:
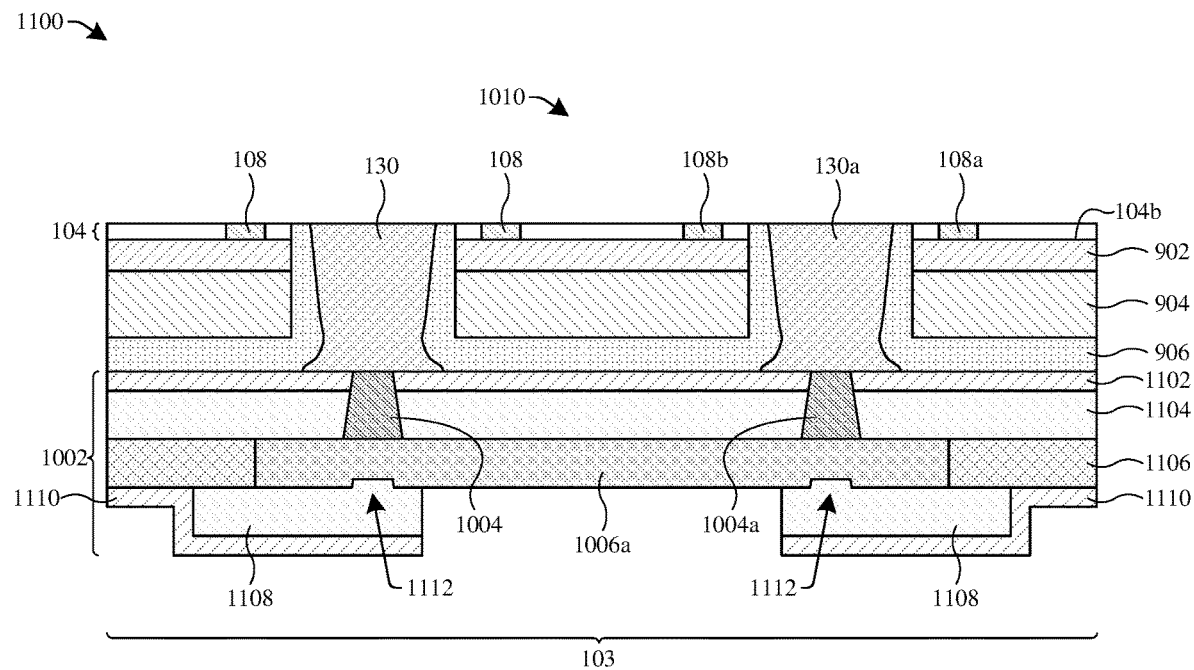
FIG. 11 illustrate a cross-sectional view of some other embodiments of an area of the IC of FIG. 10.

FIG. 11 illustrate a cross-sectional view 1100 of some other embodiments of an area 1010 of the IC of FIG. 10.

As shown in the cross-sectional view 1100 of FIG. 11, the passivation structure 1002 may comprise a first passivation layer 1102, a second passivation layer 1104, a third passivation layer 1106, a fourth passivation layer 1108, and a fifth passivation layer 1110. The first passivation layer 1102, the second passivation layer 1104, the third passivation layer 1106, the fourth passivation layer 1108, and/or the fifth passivation layer 1110 may be or comprise, for example, undoped silicate glass (USG), an oxide (e.g., $SiO_2$), a nitride (e.g., SiN), an oxy-nitride (e.g., SiON), some other dielectric material, or a combination of the foregoing. In some embodiments, the first passivation layer 1102 may have a same chemical composition as the fifth passivation layer 1110. In further embodiments, the second passivation layer 1104, the third passivation layer 1106, and the fourth passivation layer 1108 may have a same chemical composition. In some embodiments, the first dielectric structure 902, the second dielectric structure 904, and the dielectric liner structure 906 are vertically disposed between the passivation structure 1002 and the substrate 104.

The first passivation layer 1102 is disposed vertically between the second passivation layer 1104 and the dielectric liner structure 906. The second passivation layer 1104 is disposed vertically between the first passivation layer 1102 and the third passivation layer 1106. The third passivation layer 1106 is disposed vertically between the fourth passivation layer 1108 and the second passivation layer 1104. The third passivation layer 1106 is disposed vertically between the fifth passivation layer 1110 and the second passivation layer 1104. The fourth passivation layer 1108 is disposed vertically between the third passivation layer 1106 and at least a portion of the fifth passivation layer 1110. In some embodiments, the fourth passivation layer 1108 is also disposed vertically between the first I/O structure 1006a and a different portion of the fifth passivation layer 1110. In some embodiments, the first I/O structure 1006a is disposed vertically between the fourth passivation layer 1108 and the second passivation layer 1104. In some embodiments, the first I/O structure 1006a is disposed vertically between the fifth passivation layer 1110 and the second passivation layer 1104.

In some embodiments, the plurality of I/O structures 1006 are disposed in the third passivation layer 1106. In further embodiments, the plurality of conductive vias 1004 may be disposed in the first passivation layer 1102 and the second passivation layer 1104. In some embodiments, one or more conductive vias of the plurality of conductive vias 1004 electrically coupled the first I/O structure 1006a to a corresponding set of BTSVs of the plurality of BTSVs 130. In yet further embodiments, the first I/O structure 1006a may comprise one or more notches 1112. The fourth passivation layer 1108 may be disposed in (e.g., fill) the one or more notches 1112. The one or more notches 1112 may be substantially aligned with the one or more conductive vias that are electrically coupled to the first I/O structure 1006a. While not shown in FIG. 11, it will be appreciated that the first passivation layer 1102, the second passivation layer 1104, the third passivation layer 1106, the fourth passivation layer 1108, the fifth passivation layer 1110, and/or the one or more notches 1112 are also disposed in a substantially similar manner in the device region 102 (not shown in FIG. 11) of the IC.

FIGS. 12-21 illustrate a series of cross-sectional views 1200-2100 of some embodiments of a method for forming an IC comprising a BTSV electrically coupled to a conductive line of a first conductive layer of a plurality of conductive layers. Although FIGS. 12-21 are described with reference to a method, it will be appreciated that the structures shown in FIGS. 12-21 are not limited to the method but rather may stand alone separate of the method. For ease of illustration, FIGS. 13-21 only illustrate the testing region 103 of the workpiece 1202 (e.g., magnified views of the testing region 103 of the workpiece 1202) illustrated in FIG. 12. Thus, while the acts illustrated in the cross-sectional views 1300-2100 of FIGS. 13-21 are only shown occurring in the testing region 103, it will be appreciated that such acts are also being implemented in the remaining portions of the workpiece 1202 (e.g., the device region 102). It will also be appreciated that the structures illustrated in FIGS. 13-21 are flipped (e.g., rotated 180 degrees) in relation to the structure illustrated in FIG. 12 to better illustrate a typical orientation of such structures during the acts of the method.

Figure 12:
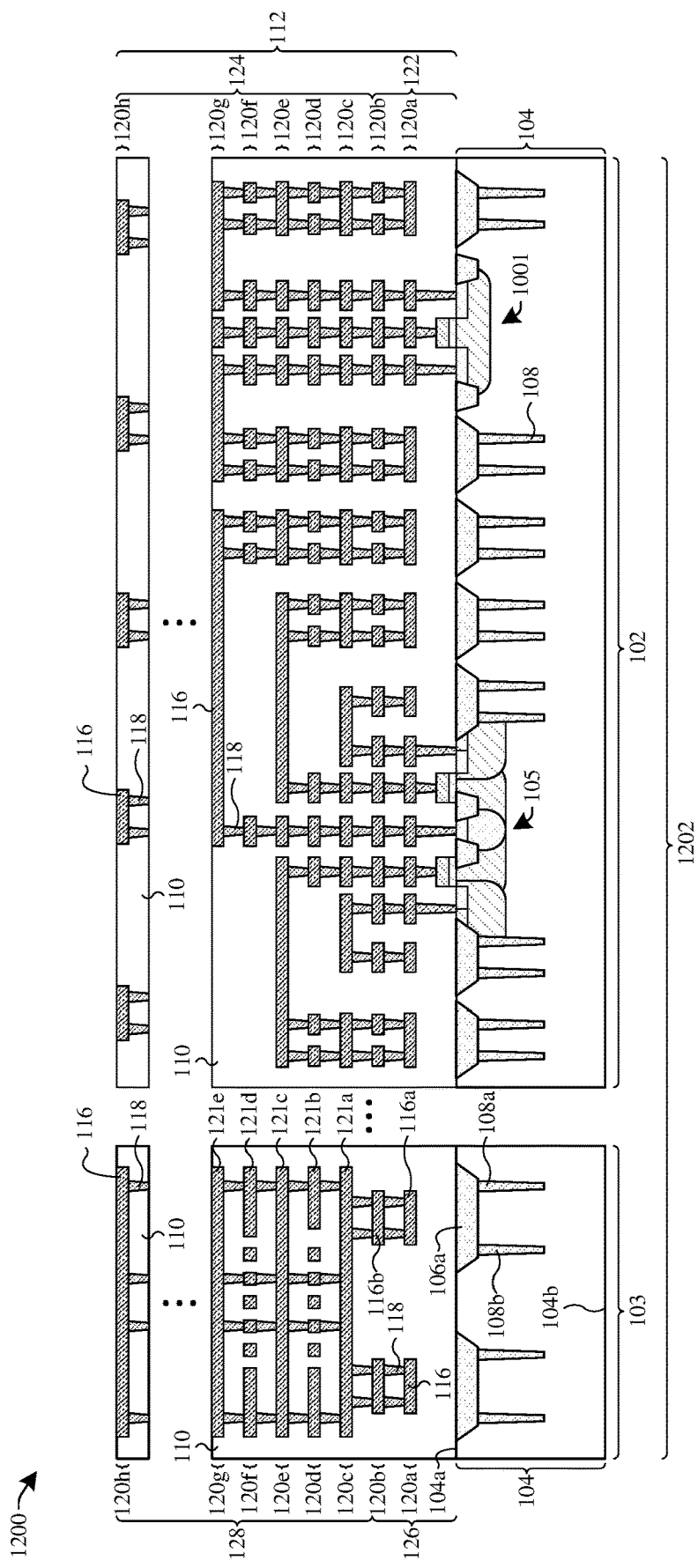
FIGS. 12-21 illustrate a series of cross-sectional views of some embodiments of a method for forming an IC comprising a BTSV electrically coupled to a conductive line of a first conductive layer of a plurality of conductive layers.

As shown in the cross-sectional view 1200 of FIG. 12, a workpiece 1202 is provided. The workpiece 1202 comprises a device region 102 and a testing region 103. The workpiece 1202 comprises a substrate 104. A semiconductor device 105 is disposed on the substrate 104. In some embodiments, the semiconductor device 1001 is disposed on the substrate 104. A plurality of STI structures 106 are disposed in the substrate 104. A plurality of DTI structures 108 are disposed in the substrate 104. An ILD structure 110 is disposed over a first side (e.g., front-side) of the substrate 104. A conductive interconnect structure 112 is disposed in the ILD structure 110. The conductive interconnect structure 112 comprises a plurality of conductive contacts 114, a plurality of conductive lines 116, and a plurality of conductive vias 118. The plurality of conductive lines 116 are disposed in a plurality of conductive layers 120. The conductive interconnect structure 112 comprises a first lower conductive interconnect structure 122 disposed in the device region 102, a first upper conductive interconnect structure 124 disposed in the device region 102, a second lower conductive interconnect structure 126 disposed in the testing region 103, and a second upper conductive interconnect structure 128 disposed in the testing region 103. The second upper conductive interconnect structure 128 comprises the plurality of conductive plates 121. The semiconductor device 105, the semiconductor device 1001, the plurality of STI structures 106, the plurality of DTI structures 108, the ILD structure 110, and the conductive interconnect structure 112 may be formed by known bipolar-CMOS-DMOS (BCD) processes.

Figure 13:
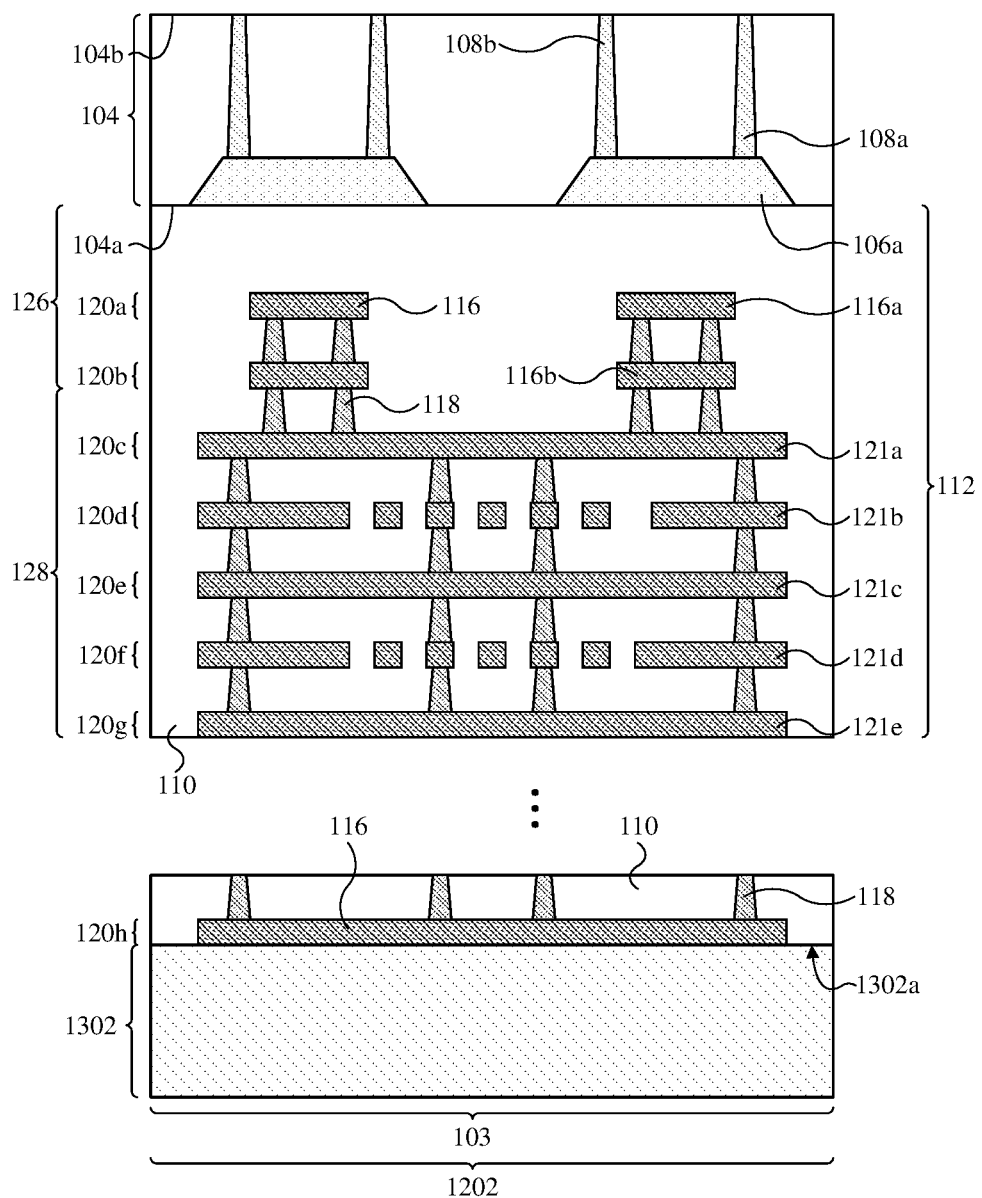

As shown in the cross-sectional view 1300 of FIG. 13, a thickness of the substrate 104 is reduced. In some embodiments, the thickness of the substrate 104 is reduced until the plurality of DTI structures 108 are exposed from a back-side of the substrate 104 (e.g., exposed through the second surface 104b of the substrate 104). In some embodiments, the thickness is reduced to between about 5 µm and about 10 µm.

In some embodiments, reducing the thickness of the substrate 104 comprises bonding a carrier substrate 1302 to an upper surface 1202a of the workpiece 1202. In some embodiments, the upper surface of the workpiece 1202 is defined by an upper surface of the ILD structure 110 and upper surfaces of the conductive lines of the uppermost conductive layer 120h. In some embodiments, the workpiece 1202 and the carrier substrate 1302 are oriented (e.g., rotated 180 degrees) so that the second surface 104b of the substrate 104 is facing upward, as shown in the cross-sectional view 1300 of FIG. 13. Thereafter, a thinning process is performed on the substrate 104 (e.g., into the second surface 104b of the substrate 104) to remove a portion of the substrate 104. The thinning process may be or comprise, for example, a chemical mechanical polishing (CMP) process, a mechanical grinding process, an etching process, some other thinning process, or a combination of the foregoing. Subsequently, the carrier substrate 1302 is removed.

Figure 14:
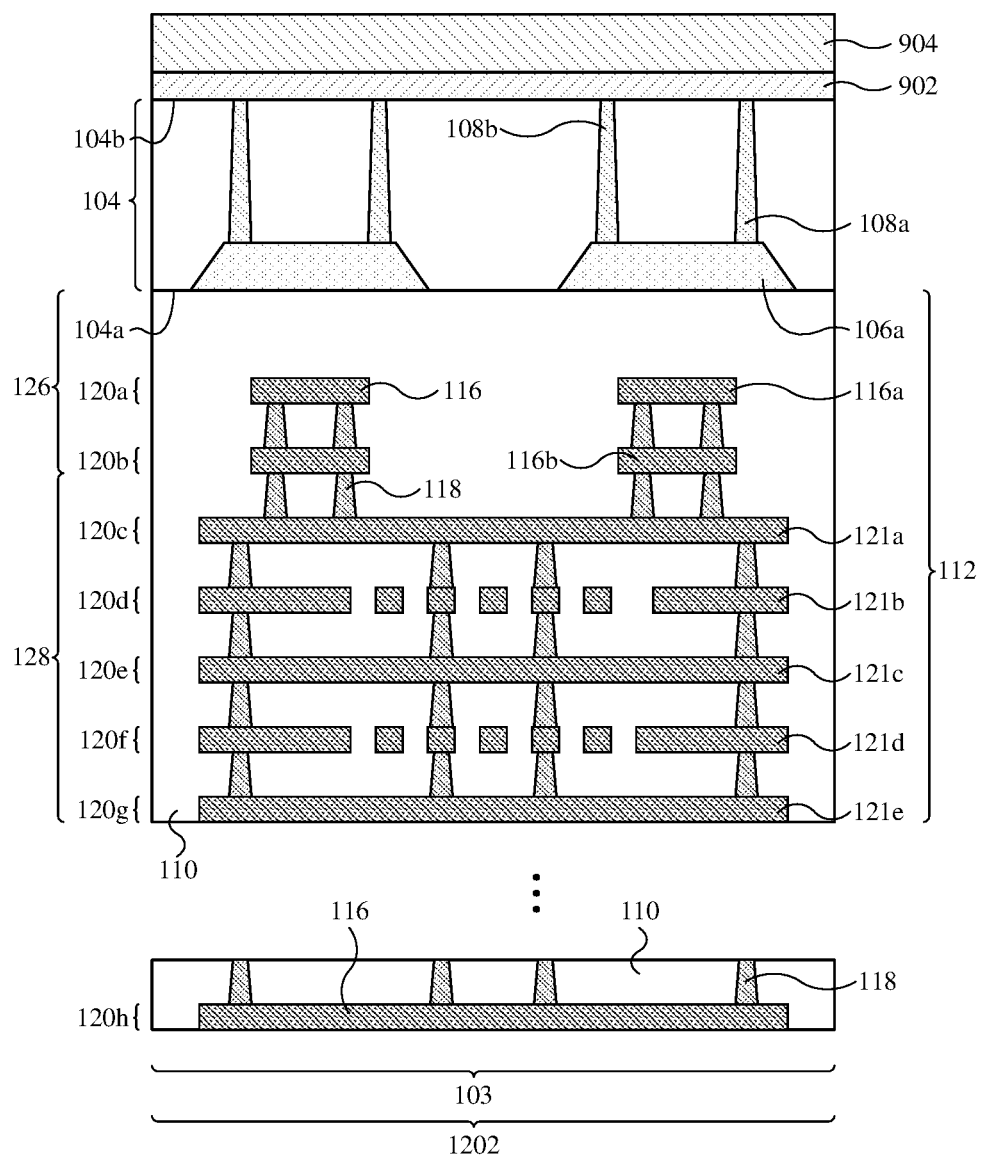

As shown in the cross-sectional view 1400 of FIG. 14, a first dielectric structure 902 is formed on a side of the substrate 104 opposite the ILD structure 110. In some embodiments, the first dielectric structure 902 is formed on the second surface 104b of the substrate 104. In some embodiments, the first dielectric structure 902 is formed on the plurality of DTI structures 108. The first dielectric structure 902 may be formed by, for example, chemical vapor deposition (CVD), physical vapor deposition (PVD), atomic layer deposition (ALD), a spin-on process, some other deposition process, or a combination of the foregoing.

Also shown in the cross-sectional view 1400 of FIG. 14, a second dielectric structure 904 is formed on a side of the first dielectric structure 902 opposite the substrate 104. In some embodiments, the second dielectric structure 904 is formed on the first dielectric structure 902. The second dielectric structure 904 may be formed by, for example, CVD, PVD, ALD, a spin-on process, some other deposition process, or a combination of the foregoing.

Figure 15:
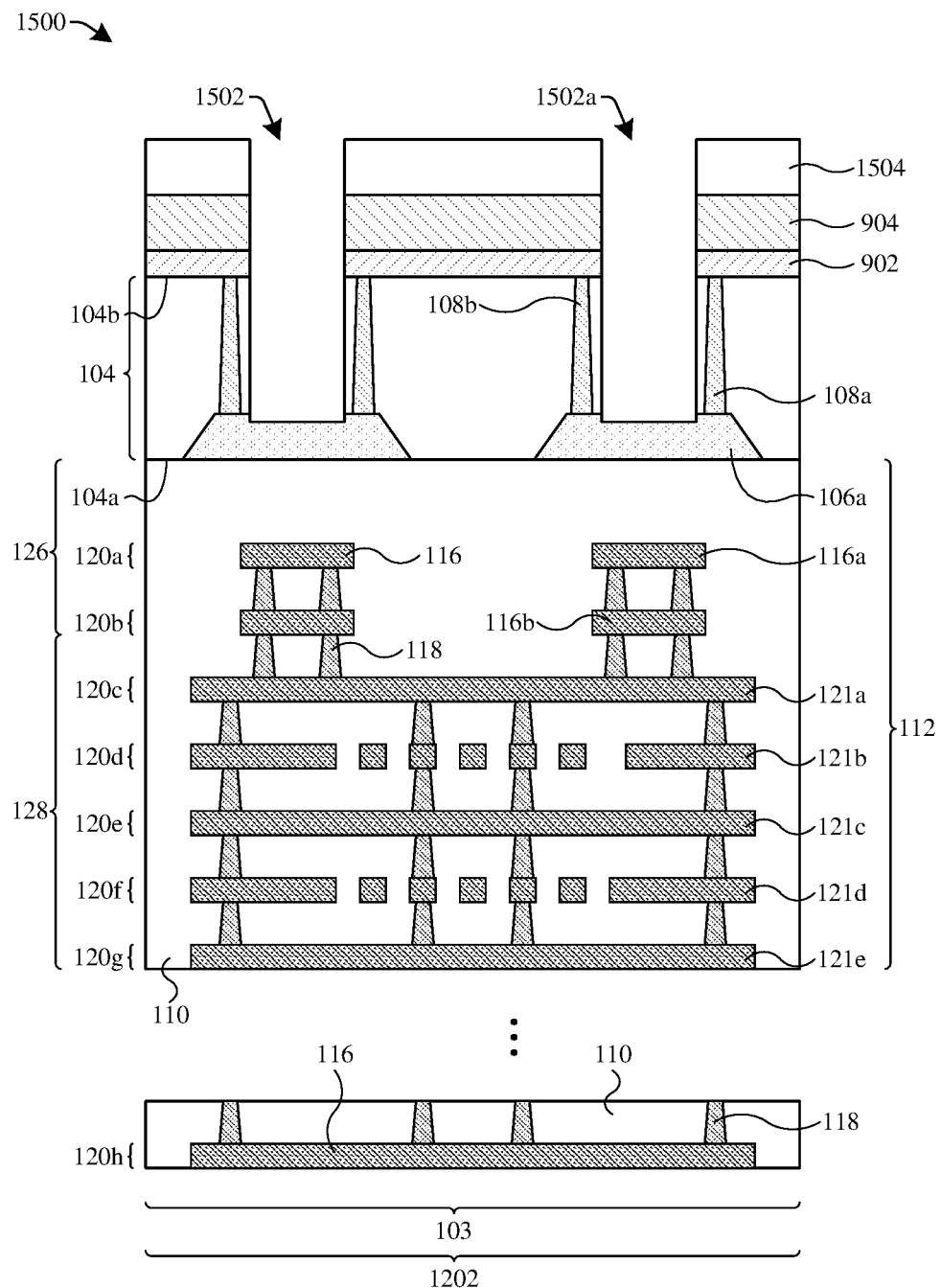

As shown in the cross-sectional view 1500 of FIG. 15, a plurality of initial trenches 1502 are formed in the substrate 104. The plurality of initial trenches 1502 penetrate the second dielectric structure 904, the first dielectric structure 902, the substrate 104, and the plurality of STI structures 106. For example, a first initial trench 1502a of the plurality of initial trenches 1502 penetrates the second dielectric structure 904, the first dielectric structure 902, the substrate 104, and the plurality of STI structures 106. The first initial trench 1502a is formed within the first ring-shaped DTI structure 108a (e.g., within the first perimeter 132). In some embodiments, the first initial trench 1502a is formed laterally between the first ring-shaped DTI structure 108a and the second ring-shaped DTI structure 108b.

The first initial trench 1502a extends vertically through the second dielectric structure 904, the first dielectric structure 902, and the substrate 104 to the first STI structure 106a. In some embodiments, the first initial trench 1502a extends vertically partially through the first STI structure 106a. A surface (e.g., lower surface in the orientation illustrated in FIG. 15) of the first initial trench 1502a may be defined by a surface of the first STI structure 106a, as shown in the cross-sectional view 1500 of FIG. 15. In some embodiments, the first initial trench 1502a has substantially straight sidewalls (e.g., substantially vertical). In other embodiments, the sidewalls of the first initial trench 1502a may be angled. It will be appreciated that each of the plurality of initial trenches 1502 may have substantially similar features (e.g., structural features) as the first initial trench 1502a.

In some embodiments, a process for forming the plurality of initial trenches 1502 comprises forming a patterned masking layer 1504 (e.g., positive/negative photoresist, hardmask, etc.) on the second dielectric structure 904. The patterned masking layer 1504 may be formed by forming a masking layer material on the second dielectric structure 904 (e.g., via a spin-on process), exposing the masking layer material to a pattern (e.g., via a lithography process, such as photolithography, extreme ultraviolet lithography, or the like), and developing the masking layer material to form the patterned masking layer 1504. Thereafter, with the patterned masking layer 1504 in place, a first etching process is performed on the second dielectric structure 904, the first dielectric structure 902, the substrate 104, and the plurality of STI structures 106, thereby forming the plurality of initial trenches 1502 according to the patterned masking layer 1504. The first etching process removes unmasked portions of the second dielectric structure 904, the first dielectric structure 902, the substrate 104, and the plurality of STI structures 106, thereby forming the plurality of initial trenches 1502. In some embodiments, the first etching process stops on the plurality of STI structures 106. In further embodiments, the first etching process may be, for example, a wet etching process, a dry etching process, a reactive ion etching (RIE) process, some other etching process, or a combination of the foregoing. The patterned masking layer 1504 is subsequently stripped away (e.g., via a plasma ashing process).

Figure 16:
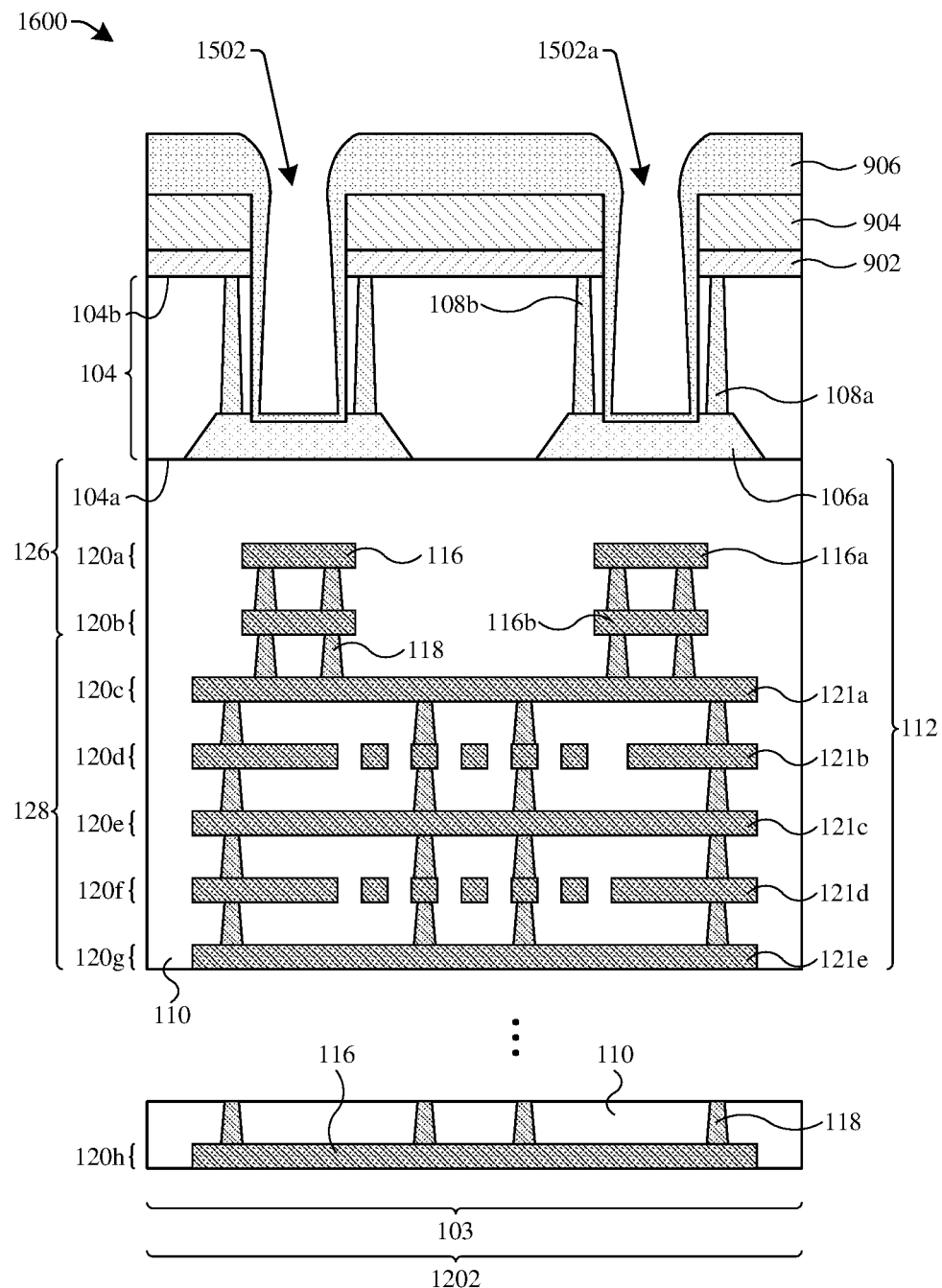

As shown in the cross-sectional view 1600 of FIG. 16, a dielectric liner structure 906 is formed lining the plurality of initial trenches 1502. The dielectric liner structure 906 lines the surfaces (e.g., sidewalls and lower surfaces, with lower in reference to the orientation illustrated in FIG. 16) of the plurality of initial trenches 1502. For example, the dielectric liner structure 906 lines sidewalls of the first initial trench 1502a and the surface of the first STI structure 106a, which defines the surface of the first initial trench 1502a. The dielectric liner structure 906 also lines an upper surface ("upper surface" in reference to the orientation illustrated in FIG. 16) of the second dielectric structure 904.

The dielectric liner structure 906 may be formed by, for example, CVD, PVD, ALD, some other deposition process, or a combination of the foregoing. In some embodiments, a process for forming the dielectric liner structure 906 comprises forming an oxide layer (e.g., $SiO_2$) (not shown) lining the second dielectric structure 904, the first dielectric structure 902, the substrate 104, and the plurality of STI structures 106; and then forming a nitride layer (e.g., SiN) (not shown) that lines the oxide layer. In such embodiments, the oxide layer and the nitride layer define the dielectric liner structure 906. In further such embodiments, the oxide layer may be formed with a thickness between about 500 Å and about 1500 Å; and the nitride layer may be formed with a thickness between about 1000 Å and about 3000 Å.

Figure 17:
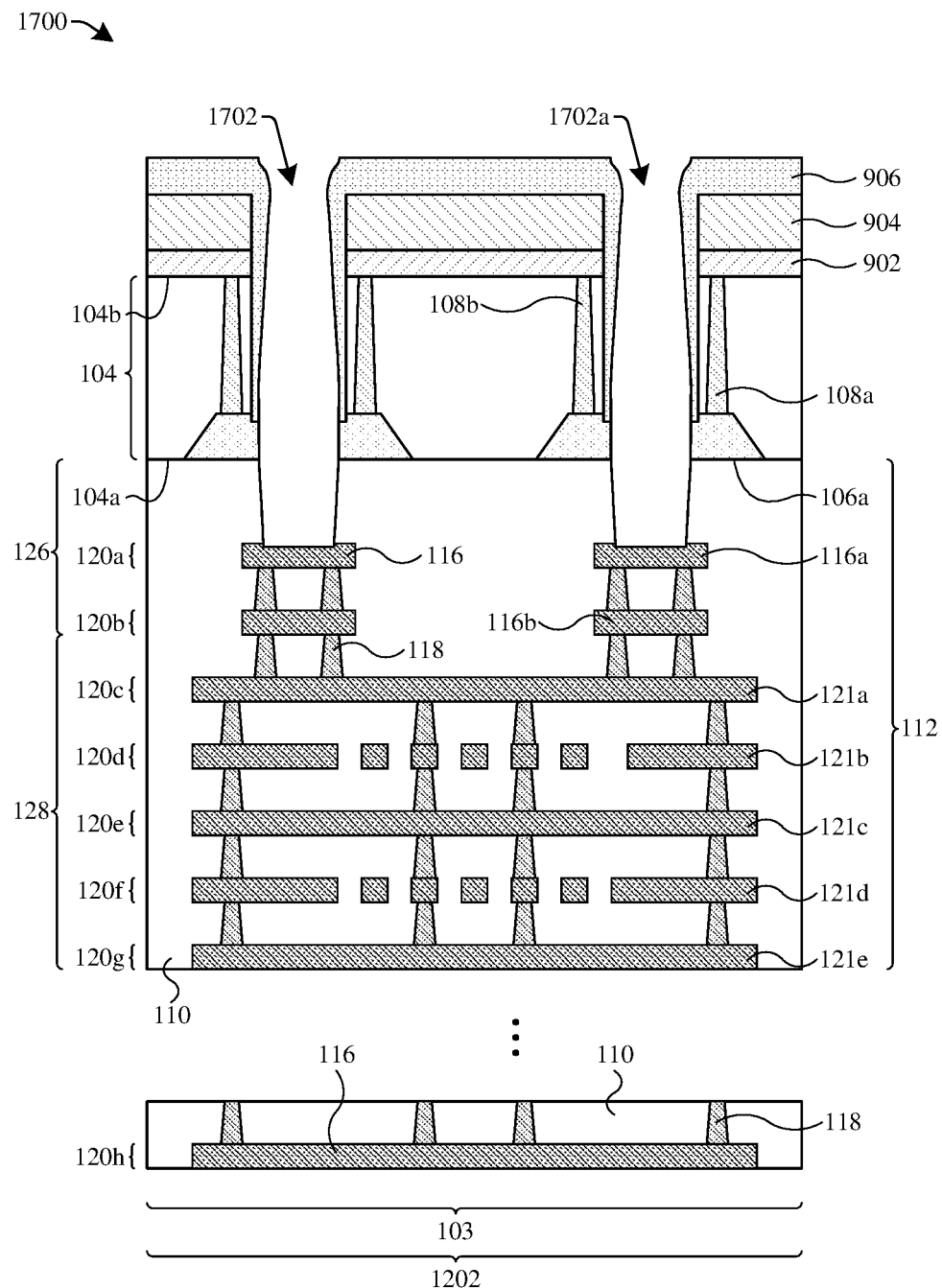

As shown in the cross-sectional view 1700 of FIG. 17, the plurality of initial trenches 1502 are extended, thereby forming a plurality of BTSV trenches 1702. The plurality of BTSV trenches 1702 penetrate the second dielectric structure 904, the first dielectric structure 902, the substrate 104, the plurality of STI structures 106, and the ILD structure 110. The plurality of BTSV trenches 1702 expose corresponding conductive lines of the first conductive layer 120a. In some embodiments, the plurality of BTSV trenches 1702 also penetrate corresponding conductive lines of the first conductive layer 120a. For example, a first BTSV trench 1702a exposes the first conductive line 116a. The first BTSV trench 1702a penetrate the second dielectric structure 904, the first dielectric structure 902, the substrate 104, the first STI structure 106a, the ILD structure 110, and the first conductive line 116a, as shown in the cross-sectional view 1700 of FIG. 17.

The first BTSV trench 1702a extends through (e.g., extends vertically through) the second dielectric structure 904, the first dielectric structure 902, the substrate 104, the first STI structure 106a, and the ILD structure 110 to the first conductive line 116a. In some embodiments, the first BTSV trench 1702a extends partially through (e.g., extends vertically partially through) the first conductive line 116a. A surface (e.g., lower surface in the orientation illustrated in FIG. 17) of the first BTSV trench 1702a may be defined by a surface (e.g., upper surface in the orientation illustrated in FIG. 17) of the first conductive line 116a, as shown in the cross-sectional view 1700 of FIG. 17. In some embodiments, a profile of the first BTSV trench 1702a has an hourglass-like shape. It will be appreciated that each of the plurality of BTSV trenches 1702 may have substantially similar features (e.g., structural features) as the first BTSV trench 1702a.

In some embodiments, a process for extending the plurality of initial trenches 1502 to form the plurality of BTSV trenches 1702 comprises performing a second etching process on the structure illustrated in FIG. 16 to penetrate the second dielectric structure 904, the plurality of STI structures 106, and the ILD structure 110. In some embodiments, the second etching process also penetrates the corresponding conductive lines of the first conductive layer 120a. The second etching process is performed after the first etching process. The second etching process is a highly anisotropic etching process (e.g., highly vertical etch) that removes more of the horizontal portions of the dielectric liner structure 906 than vertical portions of the dielectric liner structure 906. For example, as shown in the cross-sectional view 1700 of FIG. 17, the second etching process removes the horizontal portions that are disposed on the plurality of STI structures 106. The second etching process also reduces a thickness of the portions of the dielectric liner structure 906 that are disposed over the upper surface ("over" and "upper surface" in reference to the orientation illustrated in FIG. 17) of the second dielectric structure 904. The second etching process further removes portions of the plurality of STI structures 106, portions of the ILD structure 110, and portions of the conductive lines of the first conductive layer 120a that underlie ("underlie" in reference to the orientation illustrated in FIG. 17) the plurality of initial trenches 1502, thereby forming the plurality of BTSV trenches 1702. In some embodiments, the second etching process may be, for example, a wet etching process, a dry etching process, a RIE process, some other etching process, or a combination of the foregoing.

Figure 18:
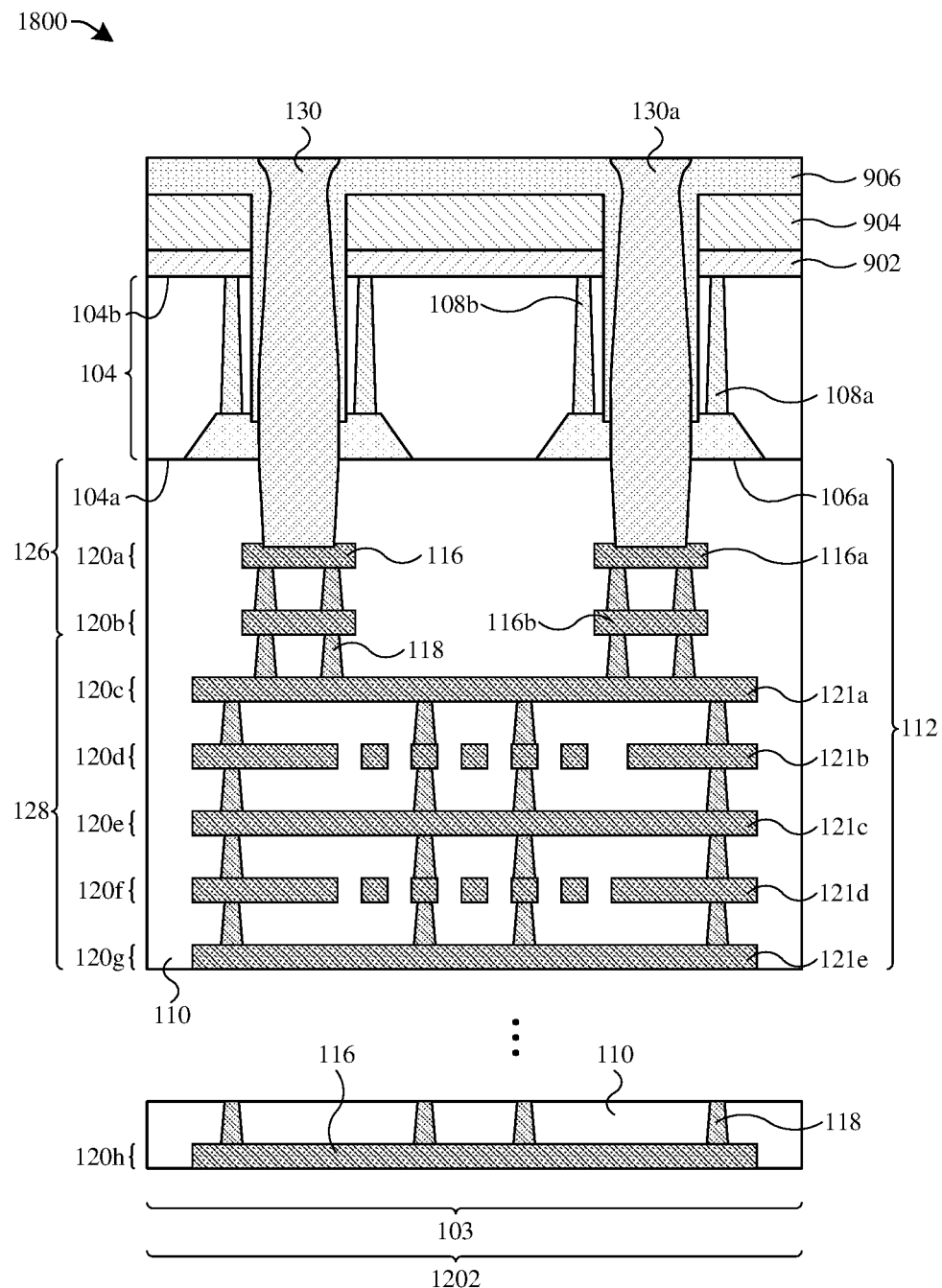

As shown in the cross-sectional view 1800 of FIG. 18, a plurality of BTSVs 130 are formed in the plurality of BTSV trenches 1702 (see, FIG. 17), respectively. The plurality of BTSVs 130 are formed electrically coupled to their corresponding conductive line of the first conductive layer 120a. For example, a first BTSV 130a is formed in the first BTSV trench 1702a. The first BTSV 130a is formed electrically coupled to the first conductive line 116a.

In some embodiments, a process for forming the plurality of BTSVs 130 comprises filling the plurality of BTSV trenches 1702 with a metal material (not shown) (e.g., copper (Cu), tantalum nitride (TaN), aluminum (Al), gold (Au), silver (Ag), platinum (Pt), or the like). In some embodiments, filling the plurality of BTSV trenches 1702 comprising depositing the metal material in the plurality of BTSV trenches 1702 and over ("over" in reference to the orientation illustrated in FIG. 18) the dielectric liner structure 906. In some embodiments, the metal material may be deposited by, for example, CVD, PVD, ALD, sputtering, electrochemical plating, electroless plating, some other deposition process, or a combination of the foregoing. Thereafter, an upper portion ("upper portion" in reference to the orientation illustrated in FIG. 18) of the metal material is removed, thereby leaving remaining portions of the metal material in the plurality of BTSV trenches 1702 as the plurality of BTSVs 130. The upper portion of the metal material may be removed by, for example, a CMP process, an etching process, some other suitable, or a combination of the foregoing. In some embodiments, a planarization process (e.g., CMP) is performed on the metal material and the dielectric liner structure 906 to planarize surfaces of the plurality of BTSVs 130 (e.g., upper surfaces in relation to the orientation illustrated in FIG. 18) and planarize a surface of the dielectric liner structure 906 (e.g., an upper surface in relation to the orientation illustrated in FIG. 18).

In some embodiments, the process for forming the plurality of BTSVs 130 comprises baking (e.g., heating for a period of time) the structure illustrated in FIG. 17. Thereafter, a liner layer (not shown) is formed lining the plurality of BTSV trenches 1702. In some embodiments, the liner layer may be, for example, tantalum nitride (TaN), some other suitable liner material, or a combination of the foregoing. In other embodiments, the liner layer is omitted. A seed layer (e.g., copper seed layer) may then be formed in the plurality of BTSV trenches 1702. Thereafter, a plating process (e.g., copper plating process) is performed to deposit the metal material in the plurality of BTSV trenches 1702.

Figure 19:
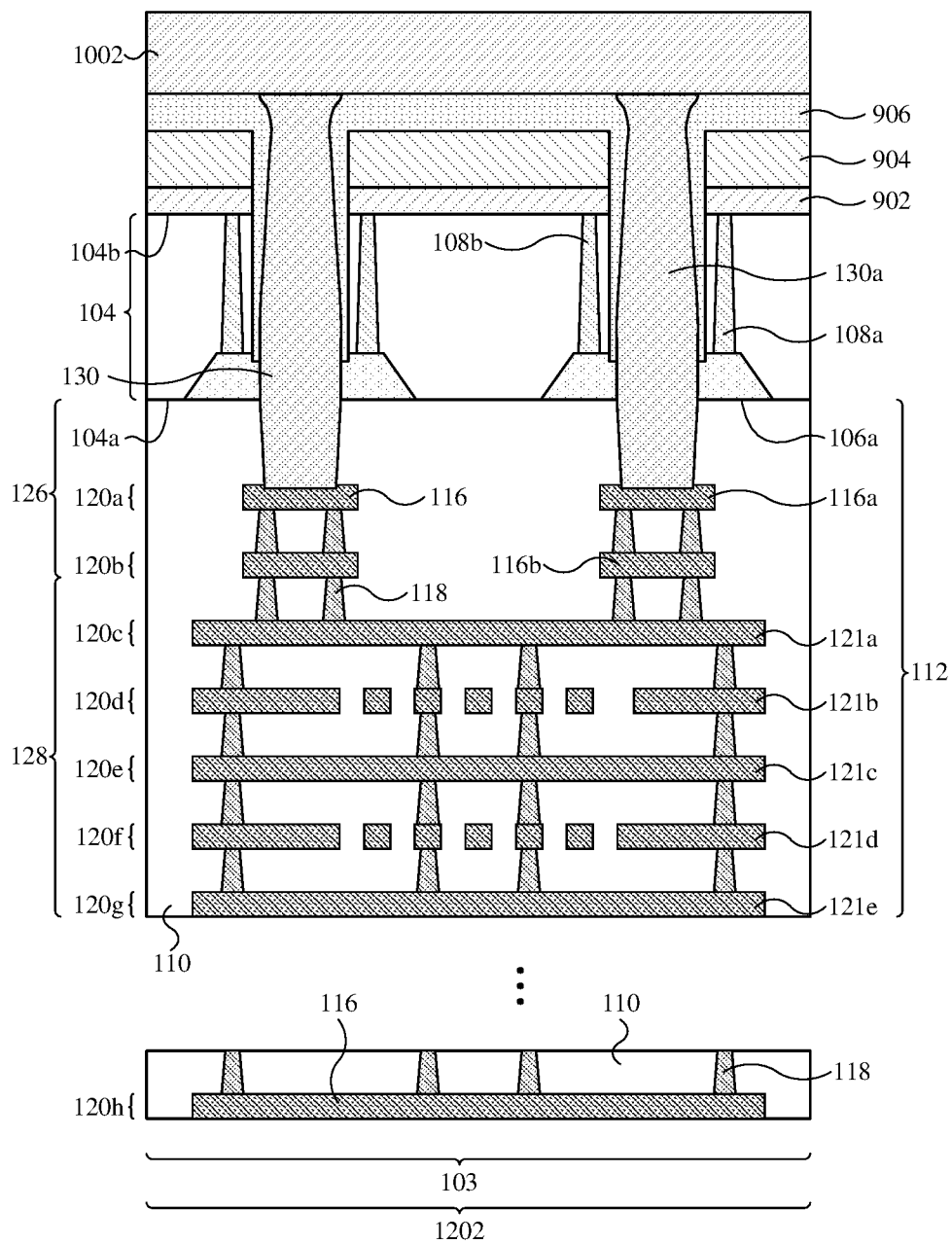

As shown in the cross-sectional view 1900 of FIG. 19, a passivation structure 1002 is formed on a side of (opposite the substrate 104) the dielectric liner structure 906 and the plurality of BTSVs 130. In some embodiments, the passivation structure 1002 is formed on the dielectric liner structure 906 and the plurality of BTSVs 130. The passivation structure 1002 may be formed by, for example, CVD, PVD, ALD, a spin-on process, some other deposition process, or a combination of the foregoing. In some embodiments, forming the passivation structure 1002 comprises depositing a first dielectric layer (e.g., SiN) on the dielectric liner structure 906 and the plurality of BTSVs 130, and then depositing a second dielectric layer (e.g., USG) on the first dielectric layer.

Figure 20:
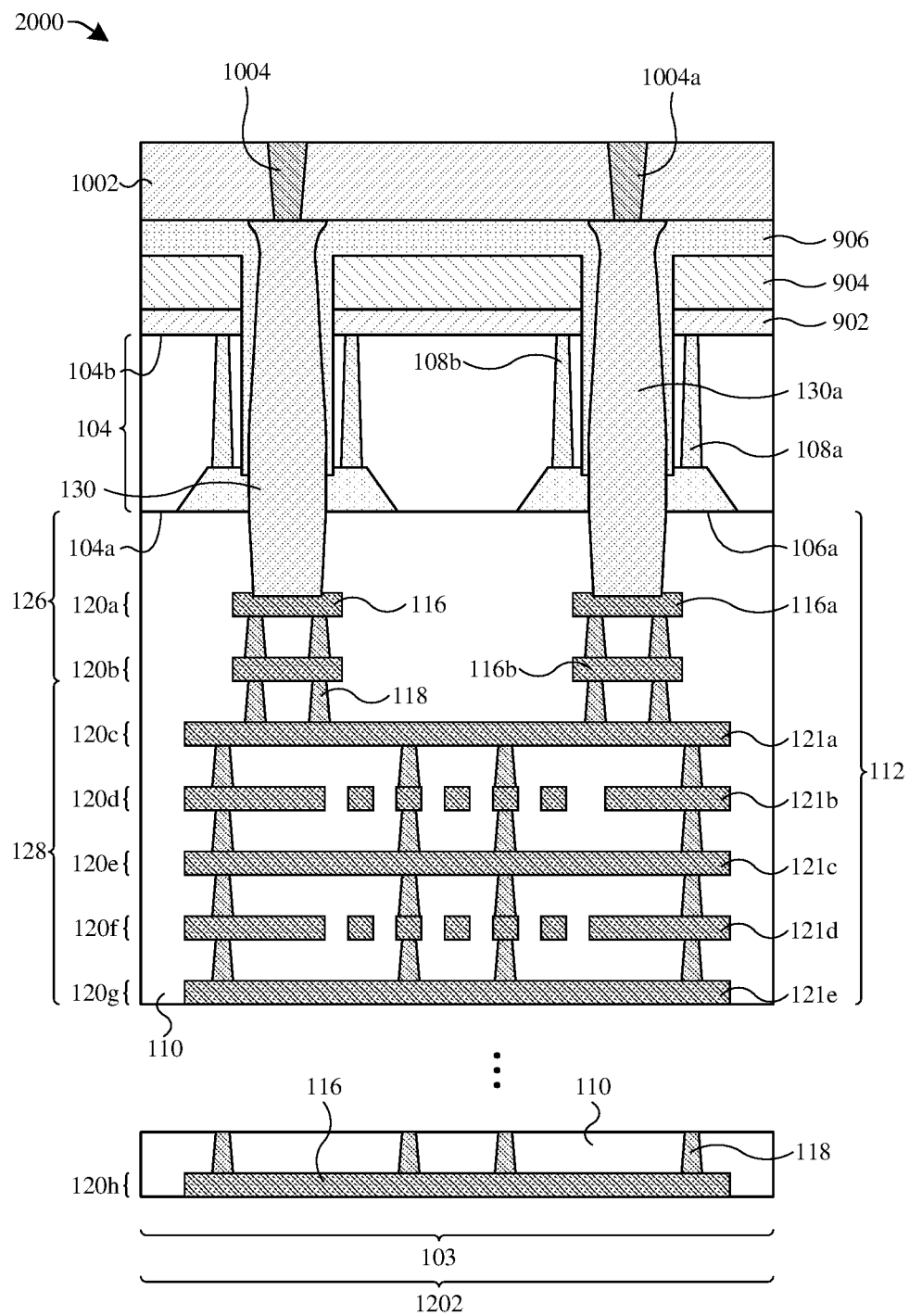

As shown in the cross-sectional view 2000 of FIG. 20, a plurality of conductive vias 1004 are formed in the passivation structure 1002. The plurality of conductive vias 1004 are formed electrically coupled to the plurality of BTSVs 130. For example, a first conductive via 1004a of the plurality of conductive vias 1004 is formed in the passivation structure 1002 and electrically coupled to the first BTSV 130a.

In some embodiments, a process for forming the plurality of conductive vias 1004 comprises forming a patterned masking layer (e.g., positive/negative photoresist, hardmask, etc.) on the passivation structure 1002. Thereafter, with the patterned masking layer in place, an etching process (e.g., a wet etching process, dry etching process, RIE process, or the like) is performed on the passivation structure 1002, thereby forming a plurality of openings (not shown) in the passivation structure 1002 according to the patterned masking layer. Subsequently, the patterned masking layer is stripped away (e.g., via a plasma ashing process).

A metal material is then deposited on the passivation structure 1002 and in the opening. The metal material may be or comprise, for example, aluminum-based alloy (e.g., aluminum-copper (AlCu)), copper (Cu), aluminum (Al), tungsten (W), gold (Au), silver (Ag), platinum (Pt), some other metal, or a combination of the foregoing. The metal material may be deposited by, for example, CVD, PVD, ALD, sputtering, electrochemical plating, electroless plating, some other deposition process, or a combination of the foregoing. Thereafter, a planarization process (e.g., CMP) is performed on the metal material to remove a portion of the metal material, thereby leaving remaining portions of the metal material in the plurality of openings as the plurality of conductive vias 1004.

Figure 21:
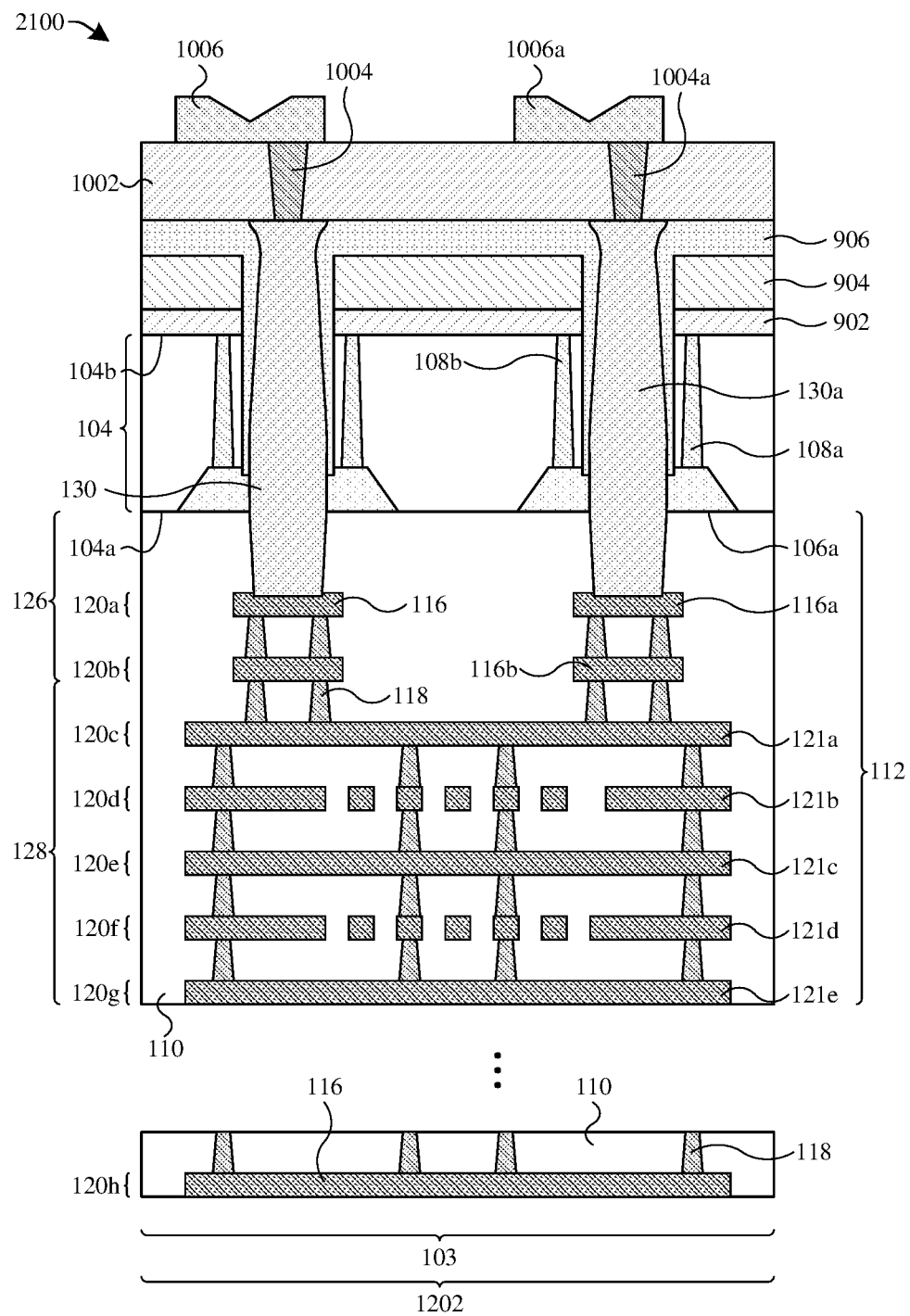

As shown in the cross-sectional view 2100 of FIG. 21, a plurality of I/O structures 1006 are formed on a side of (opposite the substrate 104) the passivation structure 1002 and the plurality of conductive vias 1004. The plurality of I/O structures 1006 are formed electrically coupled to the plurality of conductive vias 1004. For example, a first I/O structure 1006a is formed over the passivation structure 1002 and the first conductive via 1004a. The first I/O structure 1006a is formed electrically coupled to the first conductive via 1004a.

In some embodiments, a process for forming the plurality of I/O structures 1006 comprises depositing a metal material on the passivation structure 1002. The metal material may be or comprise, for example, aluminum-based alloy (e.g., aluminum-copper (AlCu)), copper (Cu), aluminum (Al), tungsten (W), gold (Au), silver (Ag), platinum (Pt), some other metal, or a combination of the foregoing. The metal material may be deposited by, for example, CVD, PVD, ALD, sputtering, electrochemical plating, electroless plating, some other deposition process, or a combination of the foregoing. Thereafter, a patterned masking layer (e.g., positive/negative photoresist, hardmask, etc.) is formed on the metal material. Thereafter, with the patterned masking layer in place, an etching process (e.g., a wet etching process, dry etching process, RIE process, or the like) is performed on the metal material, thereby forming the plurality of I/O structures 1006 according to the masking layer. Subsequently, the patterned masking layer is stripped away (e.g., via a plasma ashing process). It will be appreciated that the plurality of I/O structures 1006 may be formed by other suitable processes (e.g., a damascene process). It will be appreciated that a grid structure 1008 (see, FIG. 10) may be formed in a substantially similar manner as the plurality of I/O structures 1006.

Figure 22:
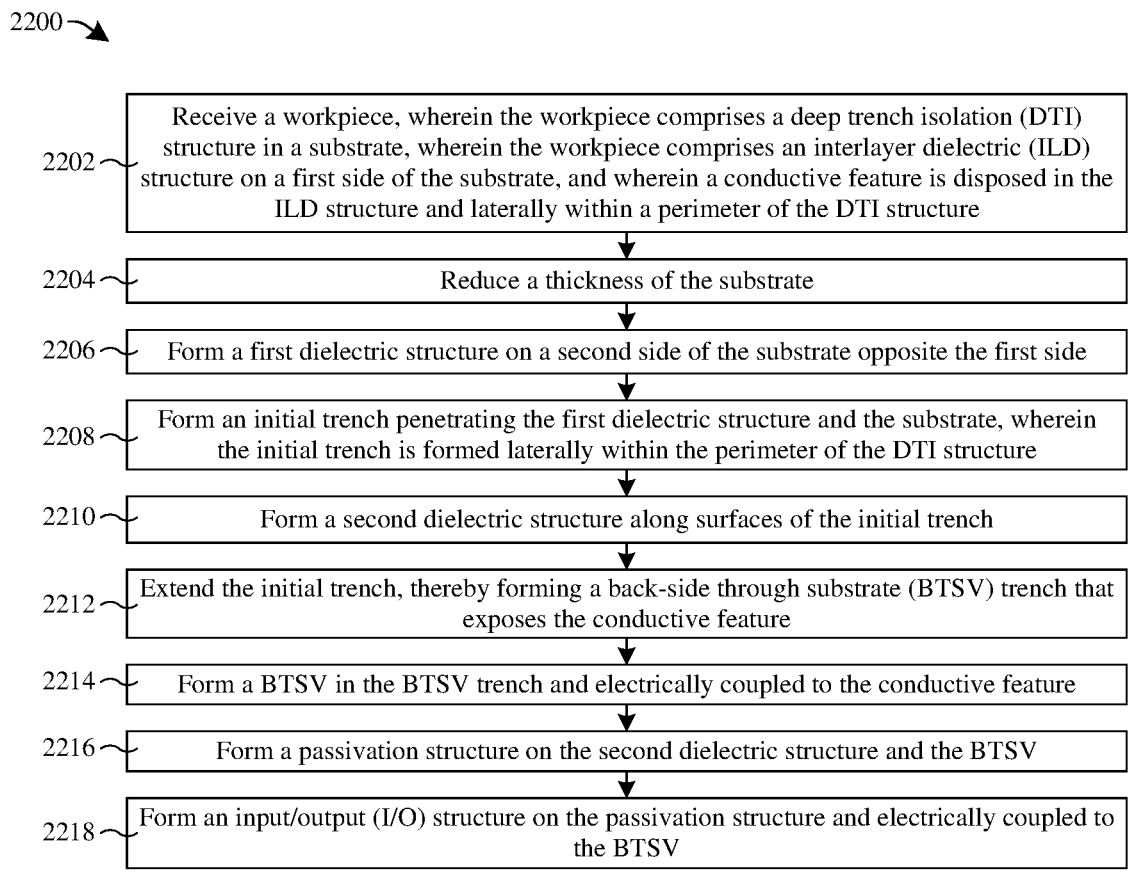
FIG. 22 illustrates a flowchart of some embodiments of a method for forming an IC comprising a BTSV electrically coupled to a conductive line of a first conductive layer of a plurality of conductive layers.

FIG. 22 illustrates a flowchart 2200 of some embodiments of a method for forming an IC comprising a BTSV electrically coupled to a conductive line of a first conductive layer of a plurality of conductive layers. While the flowchart 2200 of FIG. 22 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 2202, a workpiece is received. The workpiece comprises a deep trench isolation (DTI) structure in a substrate and an interlayer dielectric (ILD) structure on a first side of the substrate. A conductive feature is disposed in the ILD structure and laterally within a perimeter of the DTI structure. FIG. 12 illustrates a cross-sectional view 1200 of some embodiments corresponding to act 2202.

At act 2204, a thickness of the substrate is reduced. FIG. 13 illustrates a cross-sectional view 1300 of some embodiments corresponding to act 2204.

At act 2206, a first dielectric structure is formed on a second side of the substrate opposite the first side of the substrate. FIG. 14 illustrates a cross-sectional view 1400 of some embodiments corresponding to act 2206.

At act 2208, an initial trench is formed penetrating the first dielectric structure and the substrate, wherein the initial trench is formed laterally within the perimeter of the DTI structure. FIG. 15 illustrates a cross-sectional view 1500 of some embodiments corresponding to act 2208.

At act 2210, a second dielectric structure is formed along surfaces of the initial trench. FIG. 16 illustrates a cross-sectional view 1600 of some embodiments corresponding to act 2210.

At act 2212, the initial trench is extended, thereby forming a back-side through substrate (BTSV) trench that exposes the conductive feature. FIG. 17 illustrates a cross-sectional view 1700 of some embodiments corresponding to act 2212.

At act 2214, a BTSV is formed in the BTSV trench and formed electrically coupled to the conductive feature. FIG. 18 illustrates a cross-sectional view 1800 of some embodiments corresponding to act 2214.

At act 2216, a passivation structure is formed on the second dielectric structure and on the BTSV. FIG. 19 illustrates a cross-sectional view 1900 of some embodiments corresponding to act 2216.

At act 2218, an input/output (I/O) structure is formed on the passivation structure and formed electrically coupled to the BTSV. FIGS. 20-21 illustrate a series of cross-sectional views 2000-2100 of some embodiments corresponding to act 2218.

In some embodiments, the present application provides an integrated chip (IC). The IC comprises a first ring-shaped deep trench isolation (DTI) structure disposed in a semiconductor substrate. A dielectric structure is disposed over the semiconductor substrate. A conductive interconnect structure is disposed in the dielectric structure. The conductive interconnect structure comprises a lower conductive interconnect structure. The conductive interconnect structure comprises an upper conductive interconnect structure disposed over and electrically coupled to the lower conductive interconnect structure. The upper conductive interconnect structure comprises a plurality of conductive plates. The plurality of conductive plates are vertically stacked and electrically coupled together. A back-side through substrate via (BTSV) is disposed in the semiconductor substrate and the dielectric structure, wherein the BTSV extends from a first conductive feature of the lower conductive interconnect structure through both the dielectric structure and the semiconductor substrate, wherein the first conductive feature of the lower conductive interconnect structure is disposed at least partially laterally within a perimeter of the first ring-shaped DTI structure, and wherein the BTSV is disposed within the perimeter of the first ring-shaped DTI structure.

In some embodiments, a lowermost surface of the first conductive feature of the lower conductive interconnect structure is vertically spaced from the semiconductor substrate.

In some embodiments, at least one of the plurality of conductive plates comprises a testing pad indicator structure.

In some embodiments, the plurality of conductive plates have outer perimeters, respectively; and each of the outer perimeters have a substantially similar size and shape.

In some embodiments, each of the plurality of conductive plates comprises a plurality of slats; the plurality of slates of a first conductive plate of the plurality of conductive plates extend laterally in a first direction; the plurality of slates of a second conductive plate of the plurality of conductive plates extend laterally in a second direction perpendicular to the first direction; and the second conductive plate is disposed nearer the first conductive plate than any other conductive plates of the plurality of conductive plates.

In some embodiments, the lower conductive interconnect structure comprises a plurality of dummy structures disposed within the perimeter of the first ring-shaped DTI structure; and the plurality of dummy structures are disposed within an array comprising a plurality of rows and a plurality of columns.

In some embodiments, a first conductive plate of the plurality of conductive plates comprises a first plurality of conductive slats that extend laterally in a first direction; and the first plurality of conductive slats extend laterally in the first direction between neighboring rows of the plurality of rows.

In some embodiments, a second conductive plate of the plurality of conductive plates comprises a second plurality of conductive slats that extend laterally in a second direction perpendicular to the first direction; and the second plurality of conductive slats extend laterally in the second direction between neighboring columns of the plurality of columns.

In some embodiments, a second ring-shaped DTI structure is disposed in the semiconductor substrate, wherein the second ring-shaped DTI structure is disposed within the perimeter of the first ring-shaped DTI structure, and wherein the BTSV is disposed laterally between the perimeter of the first ring-shaped DTI structure and a perimeter of the second ring-shaped DTI structure.

In some embodiments, a shallow trench isolation (STI) structure is disposed in the semiconductor substrate, wherein the first ring-shaped DTI structure and the second ring-shaped DTI structure both penetrate the STI structure, and wherein the BTSV extends vertically through the STI structure.

In some embodiments, the lower conductive interconnect structure comprises a second conductive feature different than the first conductive feature; the first conductive feature and the second conductive feature are both disposed along a plane that extends laterally in parallel with an upper surface of the semiconductor substrate; a third conductive feature of the lower conductive interconnect structure extends vertically from the semiconductor substrate to the second conductive feature; the third conductive feature is disposed within the perimeter of the first ring-shaped DTI structure; and the third conductive feature electrically couples the second conductive feature to a region of the semiconductor substrate that is laterally surrounded by the first ring-shaped DTI structure.

In some embodiments, a second ring-shaped DTI structure is disposed in the semiconductor substrate, wherein the second ring-shaped DTI structure is disposed within the perimeter of the first ring-shaped DTI structure, wherein the BTSV is disposed laterally between the perimeter of the first ring-shaped DTI structure and a perimeter of the second ring-shaped DTI structure, wherein the third conductive feature is disposed laterally between the perimeter of the first ring-shaped DTI structure and the perimeter of the second ring-shaped DTI structure, and wherein the region of the semiconductor substrate is also disposed laterally between the perimeter of the first ring-shaped DTI structure and the perimeter of the second ring-shaped DTI structure.

In some embodiments, an input/output (I/O) structure is disposed on a first side of the semiconductor substrate, wherein the conductive interconnect structure is disposed on a second side of the semiconductor substrate opposite the first side of the semiconductor substrate, and wherein the BTSV electrically couples the I/O structure to the first conductive feature of the lower conductive interconnect structure.

In some embodiments, the present application provides an integrated chip (IC). The IC comprises a dielectric structure disposed on a side of a semiconductor substrate. A conductive interconnect structure is disposed in the dielectric structure. The conductive interconnect structure is disposed in both a device region of the IC and a testing region of the IC. A semiconductor device is disposed on the semiconductor substrate and in the device region of the IC. The testing region of the IC is disposed outside a perimeter of the semiconductor device. The conductive interconnect structure comprises a first lower conductive interconnect structure and a first upper conductive interconnect structure both disposed in the testing region of the IC. The first upper conductive interconnect structure is disposed over and electrically coupled to the first lower conductive interconnect structure. The first upper conductive interconnect structure comprises a plurality of conductive plates. The plurality of conductive plates are vertically stacked and electrically coupled together. A plurality of back-side through substrate vias (BTSVs) are disposed in the semiconductor substrate and the dielectric structure, wherein the plurality of BTSVs contact a plurality of conductive features of the first lower conductive interconnect structure, respectively, wherein each of the plurality of BTSVs extend from a corresponding one of the plurality of conductive features through both the dielectric structure and the semiconductor substrate, and wherein each of the plurality of BTSVs are disposed within the testing region of the IC.

In some embodiments, each of the conductive features of the plurality of conductive features are vertically spaced from an upper surface of the semiconductor substrate; each of the conductive features of the plurality of conductive features are disposed along a plane; and the plane extends laterally in parallel with an upper surface of the semiconductor substrate.

In some embodiments, the conductive interconnect structure comprises a second lower conductive interconnect structure and a second upper conductive interconnect structure both disposed in the device region of the IC; the second lower conductive interconnect structure comprises a conductive wire disposed along the plane; the second lower conductive interconnect structure comprises one or more conductive contacts that extend vertically from the semiconductor substrate to the conductive wire; and the one or more conductive contacts electrically couple the semiconductor device to the conductive wire.

In some embodiments, the semiconductor device is disposed nearer the testing region of the IC than any other semiconductor device of the IC.

In some embodiments, the plurality of conductive plates comprises a first conductive plate disposed over the first lower conductive interconnect structure; and each of the plurality of BTSVs are disposed at least partially laterally within an outer perimeter of the first conductive plate.

In some embodiments, the present application provides a method for forming an integrated chip (IC). The method comprises receiving a workpiece. The workpiece comprises: an interlayer dielectric (ILD) structure disposed on a first side of a semiconductor substrate; a conductive interconnect structure disposed in the ILD structure, wherein the conductive interconnect structure comprises a plurality of metal layers, wherein a first metal layer of the plurality of metal layers is disposed nearer the semiconductor substrate than each of the other metal layers of the plurality of metal layers, wherein the first metal layer comprises a conductive feature, wherein the conductive interconnect structure further comprises a stack of conductive plates that are electrically coupled together, wherein the stack of conductive plates are electrically coupled to the conductive feature, and wherein the first metal layer vertically separates the stack of conductive plates from the semiconductor substrate; a shallow trench isolation (STI) structure disposed in the semiconductor substrate; and a ring-shaped deep trench isolation (DTI) structure disposed in the semiconductor substrate, wherein the ring-shaped DTI structure penetrates the STI structure, wherein the stack of conductive plates are disposed at least partially laterally within a perimeter of the ring-shaped DTI structure, and wherein the conductive feature is disposed at least partially laterally within a perimeter of the ring-shaped DTI structure. A first dielectric structure is formed on a second side of the semiconductor substrate opposite the first side of the semiconductor substrate. An initial trench is formed penetrating the first dielectric structure and the semiconductor substrate, wherein the initial trench is formed laterally within the perimeter of the ring-shaped DTI structure, and wherein a surface of the STI structure defines a surface of the initial trench. A second dielectric structure is formed along sidewalls of the initial trench and along the surface of the initial trench. The initial trench is extended to the conductive feature, thereby forming a back-side through substrate via (BTSV) trench that exposes the conductive feature, wherein extending the initial trench comprises penetrating the second dielectric structure, the STI structure, and the ILD structure. A BTSV is formed in the BTSV trench, wherein the BTSV is electrically coupled to the conductive feature.

In some embodiments, after the BTSV is formed, a passivation structure is formed on a side of the first dielectric structure, wherein the first dielectric structure is disposed vertically between the passivation structure and the semiconductor substrate; an opening is formed in the passivation structure that exposes the BTSV; a conductive via is formed in the opening and electrically coupled to the BTSV; and an input/output (I/O) structure is formed on the conductive via, wherein the I/O structure is electrically coupled to the conductive via, and wherein both the conductive via and the passivation structure are disposed vertically between the I/O structure and the BTSV.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip (IC), the method comprising:
    receiving a workpiece comprising:
        an interlayer dielectric (ILD) structure disposed on a first side of a semiconductor substrate;
        a conductive interconnect structure disposed in the ILD structure, wherein the conductive interconnect structure comprises a plurality of metal layers, wherein a first metal layer of the plurality of metal layers is disposed nearer the semiconductor substrate than each of the other metal layers of the plurality of metal layers, wherein the first metal layer comprises a conductive feature, wherein the conductive interconnect structure further comprises a stack of conductive plates that are electrically coupled together, wherein the stack of conductive plates are electrically coupled to the conductive feature, and wherein the first metal layer vertically separates the stack of conductive plates from the semiconductor substrate;
        a shallow trench isolation (STI) structure disposed in the semiconductor substrate; and
        a ring-shaped deep trench isolation (DTI) structure disposed in the semiconductor substrate, wherein the ring-shaped DTI structure contacts the STI structure, wherein the stack of conductive plates are disposed at least partially laterally within a perimeter of the ring-shaped DTI structure, and wherein the conductive feature is disposed at least partially laterally within a perimeter of the ring-shaped DTI structure; and
    forming a first dielectric structure on a second side of the semiconductor substrate opposite the first side of the semiconductor substrate;
    forming an initial trench penetrating the first dielectric structure and the semiconductor substrate, wherein the initial trench is formed laterally within the perimeter of the ring-shaped DTI structure, and wherein a surface of the STI structure defines a surface of the initial trench;
    forming a second dielectric structure along sidewalls of the initial trench and along the surface of the initial trench;
    extending the initial trench to the conductive feature, thereby forming a back-side through substrate via (BTSV) trench that exposes the conductive feature, wherein extending the initial trench comprises penetrating the second dielectric structure, the STI structure, and the ILD structure; and
    forming a BTSV in the BTSV trench, wherein the BTSV is electrically coupled to the conductive feature.

2. The method of claim 1, further comprising:
    after the BTSV is formed, forming a passivation structure on a side of the first dielectric structure, wherein the first dielectric structure is disposed vertically between the passivation structure and the semiconductor substrate;
    forming an opening in the passivation structure that exposes the BTSV;
    forming a conductive via in the opening and electrically coupled to the BTSV; and
    forming an input/output (I/O) structure on the conductive via, wherein the I/O structure is electrically coupled to the conductive via, and wherein both the conductive via and the passivation structure are disposed vertically between the I/O structure and the BTSV.

3. A method for forming an integrated chip (IC), the method comprising:
    receiving a workpiece comprising:
        a dielectric structure disposed on a first side of a semiconductor substrate;
        a conductive interconnect structure disposed in the dielectric structure, wherein the conductive interconnect structure comprises a plurality of metal layers, wherein a first metal layer of the plurality of metal layers is disposed nearer the semiconductor substrate than each of the other metal layers of the plurality of metal layers, wherein the first metal layer comprises a first conductive feature, wherein the conductive interconnect structure comprises a stack of conductive plates that are electrically coupled together, wherein the stack of conductive plates are electrically coupled to the first conductive feature, and wherein the first metal layer vertically separates the stack of conductive plates from the semiconductor substrate; and
        a shallow trench isolation (STI) structure disposed in the semiconductor substrate;
        a ring-shaped deep trench isolation (DTI) structure disposed in the semiconductor substrate, wherein the ring-shaped DTI structure contacts the STI structure, wherein the stack of conductive plates are disposed at least partially laterally within a perimeter of the ring-shaped DTI structure, and wherein the first conductive feature is at least partially laterally within a perimeter of the ring-shaped DTI structure; and forming a first dielectric structure on a second side of the semiconductor substrate opposite the first side of the semiconductor substrate;

forming an initial trench penetrating the first dielectric structure and the semiconductor substrate, wherein the initial trench is formed laterally within the perimeter of the ring-shaped DTI structure, and wherein a surface of the STI structure defines a surface of the initial trench;

forming a second dielectric structure along sidewalls of the initial trench and along the surface of the initial trench;

extending the initial trench to the first conductive feature, thereby forming a back-side through substrate via (BTSV) trench that exposes the first conductive feature, wherein extending the initial trench comprises penetrating the second dielectric structure, the STI structure, and the dielectric structure; and forming a BTSV in the BTSV trench, wherein the BTSV is electrically coupled to the first conductive feature.

4. The method of claim 3, further comprising:

before the first dielectric structure is formed, bonding a carrier wafer to the workpiece; and reducing a thickness of the semiconductor substrate from the second side of the semiconductor substrate.

5. The method of claim 4, further comprising:

after the BTSV is formed, forming a third dielectric structure on a side of the first dielectric structure, wherein the first dielectric structure is disposed vertically between the third dielectric structure and the semiconductor substrate;

forming an opening in the third dielectric structure that exposes the BTSV;

forming a conductive via in the opening and electrically coupled to the BTSV; and forming an input/output (I/O) structure on the conductive via and on the third dielectric structure, wherein the I/O structure is electrically coupled to the conductive via, and wherein both the conductive via and the third dielectric structure are disposed vertically between the I/O structure and the BTSV.

6. The method of claim 5, wherein forming the initial trench comprises:

forming a masking layer on the first dielectric structure; and with the masking layer in place on the first dielectric structure, performing a first etching process on the first dielectric structure and the semiconductor substrate.

7. The method of claim 6, further comprising:

removing the masking layer, and wherein extending the initial trench to form the BTSV trench comprises performing a second etching process different than the first etching process to remove portions of the second dielectric structure, the STI structure, and the dielectric structure.

8. A method for forming an integrated chip (IC), the method comprising:

receiving a semiconductor substrate;

forming an interconnect structure on a first side of the semiconductor substrate, wherein the interconnect structure comprises a plurality of metal layers, wherein a first metal layer of the plurality of metal layers is disposed nearer the semiconductor substrate than each of the other metal layers of the plurality of metal layers;

forming a shallow trench isolation (STI) structure in the semiconductor substrate;

forming a ring-shaped deep trench isolation (DTI) structure in the semiconductor substrate, wherein the STI structure is arranged between the ring-shaped DTI structure and the interconnect structure;

forming a dielectric structure on a second side of the semiconductor substrate opposite the first side of the semiconductor substrate;

forming a trench through the dielectric structure, through the semiconductor substrate, and through the STI structure to expose a conductive feature of the first metal layer, wherein the trench is formed laterally within a perimeter of the ring-shaped DTI structure; and forming a backside through substrate via (BTSV) in the trench, wherein the BTSV is electrically coupled to the conductive feature of the first metal layer.

9. The method of claim 8 wherein a lowermost surface of the first metal layer is vertically spaced from the semiconductor substrate.

10. The method of claim 8 wherein the BTSV has rounded or tapered outer sidewalls that define a waist region, upper region, and lower region of the BTSV when viewed in a cross-section.

11. The method of claim 10, wherein the waist region of the BTSV is wider than the upper region of the BTSV and is wider than the lower region of the BTSV when viewed in the cross-section.

12. The method of claim 10 wherein the rounded or tapered outer sidewalls of the BTSV further define a neck region and a head region of the BTSV, wherein the neck region is arranged between the waist region and the head region.

13. The method of claim 12, wherein the neck region is wider than the waist region but narrower than the head region.

14. The method of claim 8 further comprising:

forming an input/output (I/O) structure disposed on the first side of the semiconductor substrate, wherein:

the BTSV electrically couples the I/O structure to the first metal layer.

15. The method of claim 8, wherein forming the trench, comprises:

forming an initial trench penetrating the dielectric structure and the semiconductor substrate, wherein the initial trench is formed laterally within the perimeter of the ring-shaped DTI structure, and wherein a surface of the STI structure defines a surface of the initial trench;

forming a second dielectric structure along sidewalls of the initial trench and along the surface of the initial trench; and extending the initial trench to form an extended trench that exposes the conductive feature of the first metal layer.

16. The method of claim 8, wherein the dielectric structure formed on the second side of the semiconductor substrate is formed along sidewalls and a lower surface of an initial trench in the second side of the semiconductor substrate; and wherein the trench penetrates the dielectric structure.

17. The method of claim 8, wherein the interconnect structure further comprises a plurality of conductive plates that are electrically coupled together, wherein the plurality of conductive plates are electrically coupled to the first metal layer, and wherein the first metal layer vertically separates the plurality of conductive plates from the semiconductor substrate.

18. The method of claim 17, wherein the plurality of conductive plates have outer perimeters, respectively; and each of the outer perimeters have a substantially similar size and shape.

19. The method of claim 17 wherein:
each of the plurality of conductive plates comprises a plurality of slats;
the plurality of slats of a first conductive plate of the plurality of conductive plates extend laterally in a first direction;
the plurality of slats of a second conductive plate of the plurality of conductive plates extend laterally in a second direction perpendicular to the first direction; and
the second conductive plate is disposed nearer the first conductive plate than any other conductive plates of the plurality of conductive plates.

20. The method of claim 8 wherein:
the first metal layer comprises a plurality of dummy structures disposed within the perimeter of the ring-shaped DTI structure; and
the plurality of dummy structures are disposed within an array comprising a plurality of rows and a plurality of columns.

* * * * *